US012761242B2

(12) United States Patent
Baralia et al.

(10) Patent No.: US 12,761,242 B2
(45) Date of Patent: Oct. 13, 2026

(54) METHODS AND DEVICES FOR EXTENDING A TIME PERIOD UNTIL CHANGING A MEASURING TIP OF A SCANNING PROBE MICROSCOPE

(71) Applicant: Carl Zeiss SMT GmbH, Oberkochen (DE)

(72) Inventors: Gabriel Baralia, Dieburg (DE); Rainer Becker, Pfungstadt (DE); Kinga Kornilov, Rossdorf (DE); Christof Baur, Darmstadt (DE); Hans Hermann Pieper, Darmstadt (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 113 days.

(21) Appl. No.: 18/625,314

(22) Filed: Apr. 3, 2024

(65) Prior Publication Data

US 2024/0272198 A1 Aug. 15, 2024

Related U.S. Application Data

(60) Continuation of application No. 17/829,922, filed on Jun. 1, 2022, now Pat. No. 11,977,097, which is a
(Continued)

(30) Foreign Application Priority Data

Nov. 29, 2016 (DE) ......................... 102016223659.8

(51) Int. Cl.
*G01Q 70/06* (2010.01)
*G01Q 60/38* (2010.01)
(Continued)

(52) U.S. Cl.
CPC ............ *G01Q 70/06* (2013.01); *G01Q 60/38* (2013.01); *G01Q 70/08* (2013.01); *G01Q 70/16* (2013.01);
(Continued)

(58) Field of Classification Search
None
See application file for complete search history.

(56) References Cited

U.S. PATENT DOCUMENTS 5,171,992 A 12/1992 Clabes et al.
5,312,519 A 5/1994 Sakai et al.
(Continued)

FOREIGN PATENT DOCUMENTS

CN 1993609 7/2007
DE 198 25 404 12/1999
(Continued)

OTHER PUBLICATIONS

The Examination Report issued by the European Patent Office for Application No. EP 17 811 495.5, dated Jan. 9, 2023 (With English Translation).
(Continued)

*Primary Examiner* — Eliza W Osenbaugh-Stewart
(74) *Attorney, Agent, or Firm* — Fish & Richardson P.C.

(57) ABSTRACT

The present invention relates to methods and devices for extending a time period until changing a measuring tip of a scanning probe microscope. In particular, the invention relates to a method for hardening a measuring tip for a scanning probe microscope, comprising the step of: Processing the measuring tip with a beam of an energy beam source, the energy beam source being part of a scanning electron microscope.

35 Claims, 18 Drawing Sheets

Related U.S. Application Data division of application No. 16/423,687, filed on May 28, 2019, now Pat. No. 11,353,478, which is a continuation of application No. PCT/EP2017/080257, filed on Nov. 23, 2017.

(51) Int. Cl.

| | |
|---|---|
| ***G01Q 70/08*** | (2010.01) |
| ***G01Q 70/16*** | (2010.01) |
| ***H01J 37/305*** | (2006.01) |
| ***H01J 37/317*** | (2006.01) |

(52) U.S. Cl.

CPC ........ *H01J 37/3053* (2013.01); *H01J 37/317* (2013.01)

(56) References Cited

U.S. PATENT DOCUMENTS

| | | | | |
|---|---|---|---|---|
| 5,679,952 | A | 10/1997 | Lutwyche et al. | |
| 5,935,339 | A | 8/1999 | Henderson et al. | |
| 6,190,062 | B1 | 2/2001 | Subramanian et al. | |
| 6,593,571 | B1 * | 7/2003 | Yasutake | G01Q 70/06 850/41 |
| 8,819,861 | B2 | 8/2014 | Lyding et al. | |
| 11,353,478 | B2 | 6/2022 | Baralia et al. | |
| 2002/0047091 | A1 | 4/2002 | Hantschel et al. | |
| 2002/0136674 | A1 | 9/2002 | Vane | |
| 2007/0114457 | A1 | 5/2007 | Han et al. | |
| 2008/0141764 | A1 | 6/2008 | Takaoka | |
| 2009/0106869 | A1 | 4/2009 | Park et al. | |
| 2010/0115672 | A1 * | 5/2010 | Mirkin | G01Q 40/00 850/19 |
| 2010/0186132 | A1 * | 7/2010 | Humphris | G01Q 70/06 850/1 |
| 2010/0218284 | A1 * | 8/2010 | Jahnke | G01Q 70/06 850/1 |
| 2010/0229265 | A1 | 9/2010 | Jin et al. | |
| 2012/0015678 | A1 | 1/2012 | Li et al. | |
| 2014/0007306 | A1 * | 1/2014 | Baur | G01Q 70/06 850/1 |
| 2014/0027512 | A1 | 1/2014 | Baur et al. | |
| 2014/0110608 | A1 | 4/2014 | Kim et al. | |
| 2014/0263173 | A1 | 9/2014 | Rosslee et al. | |
| 2014/0283228 | A1 * | 9/2014 | Su | G01Q 10/065 850/1 |
| 2016/0274145 | A1 | 9/2016 | Borromeo et al. | |
| 2019/0317126 | A1 | 10/2019 | Baralia et al. | |
| 2022/0291255 | A1 | 9/2022 | Baralia et al. | |

FOREIGN PATENT DOCUMENTS

| | | |
|---|---|---|
| DE | 112005001585 | 6/2007 |
| JP | H06-114481 | 4/1994 |
| JP | 2005-300442 | 10/2005 |
| JP | 2007-047107 | 2/2007 |
| JP | 2009-148889 | 7/2009 |
| JP | 2014-517299 | 7/2014 |
| KR | 1020070021711 | 2/2007 |
| KR | 1020110132150 | 12/2011 |
| WO | WO 2006/011714 | 2/2006 |
| WO | WO 2012/163518 | 12/2012 |

OTHER PUBLICATIONS

The Korean Office Action for Korean Application No. KR 10-2019-7014975 dated May 27, 2020 (with English Translation).

The Korean Office Action for Korean Application No. KR 10-2019-7014975 dated Dec. 18, 2020.

The Korean Office Action for Korean Application No. KR 10-2022-7006095, dated Jul. 14, 2022 (English Translation).

The Notice of Reasons for Rejection issued by the Korean Patent Office for Application No. KR 10-2022-7006095, dated Mar. 29, 2023 (with English Translation).

The Office Action issued by the Taiwan Patent Office for Application No. TW 10-2022-7006095, dated Dec. 18, 2023 (English Translation).

Deng et al., "Nanotube manipulation with focused ion beam", *Appl. Phys. Lett.*, vol. 88, pp. 023119-1-023119-3 (2006).

English Translation of the Rejection Decision issued by the Chinese Patent Office for Application No. CN 201780073494.8, dated Sep. 7, 2022.

Grant et al., "Surface science aspects of contamination in TEM sample preparation", *Mat. Res. Soc. Symp. Proc.*, vol. 480, pp. 49-71 (1997).

Montelius et al.—"AFM-Based Fabrication of Lateral Single-Electron Tunneling Structures for Elevated Temperature Operation", *Microelectronic Engineering*, vol. 35, pp. 281-284 (1997).

Schiffmann, "Investigation of fabrication parameters for the electron-beam-induced deposition of contamination tips used in atomic force microscopy" *Nanotechnology*, vol. 4, pp. 163-169, (1993).

Walters et al., "Atomic Force Microscope Integrated with a Scanning Electron Microscope for Tip Fabrication", *Applied Physics Letters*, vol. 65, No. 6, pp. 787-789 (Aug. 8, 1994).

Wendel, et al., "Sharpened electron beam deposited tips for high resolution atomic force microscope lithography and imaging", *Appl. Phys. Lett.*, vol. 67, No. 25, pp. 3732-3734 (Dec. 18, 1995).

Xu et al., "Configuration control of carbon nanotube probe in atomic force microscopy", *J. Vac. Sci. Technol. B*, vol. 27, No. 3, pp. 1388-1393 (May/Jun. 2009).

The Office Action and Search Report issued by the Chinese Patent Office for Application No. CN 202211642532.6, dated Aug. 8, 2025 (with English Translation).

* cited by examiner

METHODS AND DEVICES FOR EXTENDING A TIME PERIOD UNTIL CHANGING A MEASURING TIP OF A SCANNING PROBE MICROSCOPE

CROSS-REFERENCE TO RELATED APPLICATIONS

This application is a continuation of and claims priority under 35 U.S.C. § 120 to U.S. application Ser. No. 17/829,922, filed on Jun. 1, 2022, which is a divisional of U.S. application Ser. No. 16/423,687, filed on May 28, 2019, now U.S. Pat. No. 11,353,478, which is a continuation of PCT Application PCT/EP2017/080257, filed on Nov. 23, 2017, which claims priority from German Application 10 2016 223 659.8, filed on Nov. 29, 2016. The entire contents of each of these priority applications are incorporated herein by reference.

TECHNICAL FIELD

The present invention relates to methods and apparatuses for extending a time period before a measuring tip of a scanning probe microscope is changed.

BACKGROUND

Scanning probe microscopes use a measuring tip to scan a specimen or the surface thereof and thus yield measurement data for producing a representation of the topography of the specimen surface. Below, scanning probe microscopes are abbreviated SPM. A distinction is made between various SPM types depending on the type of interaction between the measuring tip and the specimen surface. Use is often made of scanning tunneling microscopes (STM), in which a voltage is applied between the specimen and the measuring tip, which do not touch one another, and the resulting tunneling current is measured.

In the microscope referred to as atomic force microscope (AFM) or scanning force microscope (SFM), a measuring probe is deflected by atomic forces of the specimen surface, typically attractive van der Waals forces and/or repulsive forces of the exchange interaction.

In addition to these conventional SPM types, there are a multiplicity of further appliance types which are used for specific fields of application, such as e.g. magnetic force microscopes or optical and acoustic near-field scanning microscopes.

Scanning probe microscopes can be used in different operating modes. In the contact mode, the measuring tip is placed onto the specimen surface and scanned over the specimen surface in this state. In this case, the distance of the SPM above the specimen can be kept constant and the deflection of the cantilever or of the spring beam carrying the measuring tip is measured and used for imaging the surface. It is also possible to keep the deflection of the cantilever constant in a closed control loop, and to track the distance of the SPM to the contour of the specimen surface.

In a second operating mode, the non-contact mode, the measuring tip is brought to a defined distance from the specimen surface and the cantilever is excited to oscillate, typically at or near the resonant frequency of the cantilever. The measuring tip is then scanned over the surface of the specimen. Since the measuring tip does not come into contact with the specimen in this operating mode, its wear is lower than in the contact mode. However, a disadvantage of this operating mode is that the measuring tip does not only scan the surface of the specimen but, for example, likewise detects contaminants and/or accumulations of moisture on the specimen surface. The measuring tip can dirty in the process. In subsequent measurements, a dirtied measuring tip detects a falsified image of a specimen surface.

In a third operating mode, the intermittent mode (or tapping mode™), the cantilever is likewise caused to carry out a forced oscillation, but the distance between the SPM and the specimen surface is chosen such that the measuring tip reaches the surface of the specimen during a small part of an oscillation period. The contour of the surface of the specimen is derived from the change in the frequency, the amplitude or the phase of the forced oscillation, which change is caused by the interaction of the measuring tip with the specimen surface.

JP H06-114481 A describes the deposition of carbon-containing nanostructures on a measuring probe of a cantilever by use of an electron beam. Subsequently, the nanostructures are formed with the aid of an ion beam, i.e., the thickness of said nanostructures is "turned off" at a predetermined diameter and the desired tip of the nanostructure is formed under the action of the ion beam.

In the article "Sharpened electron beam deposited tips for high resolution atomic force microscope lithography and imaging," Appl. Phys. Lett. 67 (28), December 1995, pp. 3732-3734, the authors M. Wendel, H. Lorenz and J. P. Kotthaus describe the production of nano-tip arrangements for structuring photoresist for lithography purposes. The nano-tips are deposited with the aid of an electron beam in the presence of organic molecules. Subsequently, the nano-tips are sharpened under the action of an oxygen plasma by virtue of the outer parts of the tips being removed by etching. During this process, the nano-tips change their form from a conical into a needle-shaped structure.

US 2014/0110608 A1 describes a method for bending or curving a nanostructure, without a movement of the nanostructure being necessary. To this end, the nanostructure is irradiated by ions in a direction perpendicular to its longitudinal axis. The nanostructure is bent in the beam direction or counter to the beam direction, depending on the kinetic energy of the radiated-in ions.

DE 198 25 404 A1 describes the deposition of a needle-shaped tip on a substrate of a cantilever of a scanning probe microscope. For the purposes of improving the mechanical stability between the needle-shaped tip and the substrate, the transition region between the needle-shaped tip and the substrate, in particular, is strengthened by the deposition of a coating film on the needle-shaped tip and/or the substrate.

US 2012/0159678 A1 describes the sharpening of an electrically conductive measuring tip in an ion beam, wherein a potential is applied to the conductive measuring probe, said potential having the same sign as the ion beam.

The article "Investigation of fabrication parameters for the electron-beam-induced deposition of contamination tips used in atomic force microscopy" by K. I. Schiffmann in Nanotechnology, 4 (1993), pp. 163-169 examines the parameters for the optimized deposition of a carbon-based measurement tip on the tip of a silicon nitride pyramid. The measuring tip is deposited by use of an electron beam and the residual gas in a vacuum chamber.

On account of the interaction with the surface of a specimen to be examined, the measuring tips of conventional SPM types are subject to a wear process and must already be replaced after a short period of use. Hard to access, very fine structures, for example narrow deep trenches, must be analyzed in the semiconductor industry, in particular. This often requires the use of fine, long measuring tips, which are referred to as "whisker tips." Measuring tips or whisker tips can be plastically deformed under the influence of a specimen, can be damaged during the interaction with the specimen and/or by handling, or can even break easily. Worn or deformed measuring tips, or even broken measuring tips, of a scanning probe microscope firstly reduce the lateral spatial resolution of the measuring appliance and, secondly, falsify the image of the specimen to be examined that is produced in a detection process.

As already explained above, dirtied or contaminated measuring tips likewise do not produce images of the examined specimen that are close to reality. Therefore, measuring tips must be cleaned at regular time intervals. If cleaning is not successful or not possible, contaminated measuring tips must likewise be replaced.

The production of measuring tips for scanning probe microscopes is a difficult, and hence expensive, process. Further, the replacement of a measuring tip of an SPM is a time-consuming, and hence cost-intensive, process since the measuring appliance cannot be used to examine a specimen while the probe is being changed. This applies, in particular, to scanning probe microscopes that operate under vacuum conditions since, as a rule, the vacuum has to be broken for the purposes of changing the probe.

The present invention therefore addresses the problem of specifying methods and apparatuses that allow a lengthening of the time intervals between probe replacements of a scanning probe microscope.

SUMMARY

According to one exemplary embodiment of the present invention, this problem is solved by a method for providing a measuring tip for a scanning probe microscope, in which the method comprises the following steps: (a) providing at least a first and at least a second measuring tip, wherein the first and the second measuring tips are arranged on a common measuring tip carrier in such a way that only the first measuring tip interacts with a specimen to be examined; and (b) irreversibly processing the first measuring tip such that, following the irreversible processing, only the second measuring tip interacts with the specimen to be examined.

A method according to the invention initially uses the first measuring tip for analyzing a specimen. The first measuring tip is worn down or the first measuring tip can dirty during the scanning of a specimen. Therefore, the first measuring tip can be sharpened and/or cleaned, i.e., repaired, at periodic time intervals. The repair processes carried out on the first measuring tip significantly lengthen the service life thereof. However, the length of the first measuring tip is gradually shortened by the wear during a scanning process and the subsequent repair processes. A second measuring tip arranged on the measuring tip carrier could likewise interact with the specimen as a result thereof. Should this state occur, the superposition of the interaction forces with the specimen detected by the two measuring tips would lead to an incorrect analysis of the specimen.

In order to prevent this, the previously used, worn, irreparably contaminated and/or damaged first measuring tip is modified within the scope of an irreversible processing process when a method according to the invention is carried out, the modification being to such an extent that said first measuring tip is no longer able to interact with the specimen during further examinations of the specimen(s) by the second measuring tip or further measuring tips arranged together on the measuring tip carrier. The irreversible processing process of the worn first measuring tip can be implemented within the scanning probe microscope. As a result, a worn and/or damaged measuring tip within the scope of a method according to the invention no longer automatically leads to a complicated replacement of the measuring tip carrier. Rather, a method according to the invention, which employs a measuring tip carrier on which a plurality of measuring tips are arranged, facilitates an extension of the time period until there is a complicated replacement of the measuring tip carrier by a factor that is at least as large as the number of measuring tips on the measuring tip carrier. Hence, the downtime of a scanning probe microscope is drastically reduced. This point is of eminent importance, particularly for a combination appliance which, in addition to a scanning probe microscope, also contains a scanning electron microscope, because a probe replacement can block both analysis tools of the combination appliance.

The first measuring tip dirties when detecting an interaction force with the specimen since particles are often adsorbed onto specimen surfaces. Therefore, the first measuring tip must be cleaned at regular time intervals. If the cleaning process, which is carried out within the SPM, fails, it is possible, as explained above, for the first measuring tip to be modified within the scope of an irreversible processing process to such an extent that the latter does not interfere with the analysis process when examining the specimen with the second measuring tip.

The two or more measuring tips arranged together on a measuring tip carrier may comprise measuring probes produced from a metallic (e.g., tungsten) or semiconducting material, for instance made of silicon, silicon dioxide and/or silicon nitride. However, in one exemplary embodiment, the measuring tips of the measuring tip carrier comprise carbon-based long, fine measuring tips, which are known as "whisker tips."

In one aspect, irreversible processing of the first measuring tip is implemented if the second measuring tip likewise interacts with the specimen to be examined and/or if the first measuring tip has a contamination that cannot be removed by a cleaning process.

The second measuring tip likewise interacts with the specimen to be examined if the length difference thereof from the first measuring tip becomes smaller than the structure height of the specimen to be measured. If this is the case, both measuring tips interact with the specimen at the same time in certain regions of the specimen. In the case of a local elevation of the specimen surface in the form of a step, the height of which corresponds to, or is greater than, the length difference of the two measuring tips, the two measuring tips image the step in the form of a double edge. If the distance of the two measuring tips from one another is greater than the length and width of a depression in a specimen to be measured, the depth of the depression is determined as too low since the shorter measuring tip already interacts with the specimen surface before the longer measuring tip has reached the base of the depression.

Further, the method may include one or more of the following steps: (i) sharpening the first and/or the second measuring tip; (ii) cleaning the first and/or the second measuring tip.

A degradation of the measuring tip by wear, plastic deformation and/or by contamination changes the information about the specimen provided by the measuring tip. By sharpening or re-sharpening and/or cleaning the employed measuring tip, the latter can be brought into a state that largely corresponds to its initial state. The images of a specimen produced by a repaired measuring tip cannot be distinguished from the images recorded by a new measuring tip.

An advantage of the described method is that the processes of sharpening and cleaning a measuring tip can be carried out in the SPM without the measuring tip having to be disassembled from the scanning probe microscope to this end.

The step of sharpening and/or the step of cleaning can be repeated once to ten times, preferably once to eight times, more preferably once to five times, and most preferably once to three times.

Typically, the second measuring tip starts to likewise interact with a specimen after this number of repair cycles.

It is an advantage of the described method that use can be made of the same processes for removing traces of use from a measuring tip (i.e., the wear and/or contamination thereof) during its time of use as for the irreversible processing of the measuring tip at the end of its service life by etching at least one part of the measuring tip.

Irreversible processing, sharpening and/or cleaning can be implemented within the scanning probe microscope.

This facilitates drastic lengthening of the time between two replacements of a measuring tip carrier in comparison with a scanning probe microscope whose probes use individual measuring tips.

The first measuring tip can have a greater length than the second measuring tip upon provision and/or the first measuring tip can have a smaller diameter than the second measuring tip.

The first measuring tip having a greater length than the second measuring tip can ensure that only the first measuring tip interacts with a specimen in the initial state. Embodying the second measuring tip with a greater diameter than the first measuring tip ensures that the second measuring tip still has a diameter suitable for its use of examining a specimen, even at the end of a plurality of cleaning and/or sharpening steps of the first measuring tip.

The irreversible processing can shorten the length of the first measuring tip to such an extent that, thereafter, only the second measuring tip interacts with the specimen to be examined.

For this to take place, the irreversible processing in one exemplary embodiment shortens the length of the first measuring tip present prior to the irreversible processing to at least such an extent that the length of the first measuring tip after the irreversible processing is shorter than the length of the second measuring tip by the length difference between the first and the second measuring tips in their initial state.

The first and the second measuring tips can have a column-shaped embodiment, and/or a free end of the first and the second measuring tips could be pointed.

The first measuring tip can have a length of 300 nm to 10 μm, preferably 350 nm to 8 μm, more preferably 400 nm to 6 μm, and most preferably 450 nm to 4 μm, and/or a length difference between the first and the second measuring probes can be 10 nm to 1000 nm, preferably 20 nm to 800 nm, more preferably 30 nm to 600 nm, most preferably 40 nm to 500 nm, and/or the second measuring probe can have a length of 100 nm to 5000 nm, preferably 120 nm to 4000 nm, more preferably 140 nm to 3000 nm, and most preferably 150 nm to 2000 nm. Further, the length difference between the first and the second measuring probes can be adapted to the greatest height difference of the specimen to be examined.

The first measuring tip can have a diameter in the range of 5 nm to 50 nm, preferably 5 nm to 40 nm, more preferably 5 nm to 30 nm, and most preferably 5 nm to 20 nm, and/or the second column can have a diameter in the range of 30 nm to 75 nm, preferably 30 nm to 65 nm, more preferably 30 nm to 55 nm, most preferably 30 nm to 45 nm, and/or the first and the second measuring tips can have a spacing of 10 nm to 1 μm, 20 nm to 800 nm, more preferably 30 nm to 600 nm, and most preferably 40 nm to 400 nm.

So that a measuring tip can supply reproducible data about a specimen to be examined, the diameter of the measuring tip should be no more than one third of the smallest structure width of the specimen to be examined.

A scanning probe microscope can comprise: (a) at least two measuring tips, which are arranged together on a measuring tip carrier in such a way that only the first measuring tip can interact with a specimen to be examined in the scanning probe microscope; and (b) a processing apparatus, which is embodied to modify the first measuring tip by irreversible processing in such a way that only the second measuring tip can interact with the specimen to be examined.

A processing apparatus can comprise an energy beam source and an imaging apparatus for the energy beam, and a storage container for an etching gas, a gas supply system and a gas flow rate control system. An energy beam source can comprise a source for an electron beam. Further, the scanning probe microscope can comprise a plasma source that is arranged outside of a reaction chamber of the scanning probe microscope.

The scanning probe microscope can be embodied to carry out a method according to any one of the aforementioned aspects.

According to another exemplary embodiment of the present invention, the problem described in the preceding section is solved by a method for hardening a measuring tip in which the method includes the step of: processing the measuring tip with a beam from an energy beam source.

The measuring tip typically comprises a carbon-based measuring tip which is produced by use of an energy beam under the provision of a carbon-containing precursor gas. The treatment of the generated measuring tip by irradiation with an energy beam without the action of the precursor gas densifies the material deposited as a measuring tip. As a result, the material of the measuring tip becomes harder and withstands the interaction forces between the measuring tip and the specimen over a longer period of time in comparison with a measuring tip not treated by an energy beam. The time period until the measurement tip is replaced is significantly extended thereby.

Further, a curvature of the tip of the measuring tip on account of plastic deformation of the material of the tip of the measuring tip as a consequence of the contact of the measuring tip by the specimen surface can be significantly reduced. This substantially reduces an incorrect interpretation of the images produced by the measurement tip.

A beam direction and a longitudinal axis of the tip of the measuring tip can include an angle of ±10°, preferably ±5°, more preferably ±2°, ±1°, when processing the measuring tip with the beam of the energy beam source. When the measuring tip is hardened by the electron beam, it is expedient if the direction of the electron beam and the longitudinal axis of the measuring tip to be hardened have the specified angle.

Preferably, carbon-based measuring tips ("whisker tips") grow in the direction of the incident energy beam. Consequently, carrying out the above-described post-processing step for hardening the produced measuring tips only requires a very low additional apparatus-based outlay.

The method further may include the step of: producing the measuring tip by use of the beam of the energy beam source and a precursor gas immediately before the measuring tip is processed by the beam of the energy beam source.

Carrying out the post-treatment step immediately after the production of the measuring tip by the energy beam used to deposit the measuring tip minimizes the adjustment outlay for the hardening step of the measuring tip.

Processing the measuring tip with the beam of an energy beam source can comprise scanning the beam of the energy beam source over a tip of the measuring tip.

An energy beam source may comprise an electron beam source. The energy beam source may be a constituent part of a scanning electron microscope. The energy beam may comprise an electron beam.

An electron beam as an energy beam is preferred since electrons firstly facilitate a spatially localized deposition of energy and secondly only have small unwanted side effects, for example in the form of material ablation from the measuring tip. Moreover, an electron beam is often required for depositing the measuring tip and hence, as a rule, it is already present in a scanning probe microscope according to the invention. Further, it is likewise conceivable to use ions, atoms or molecules for the purposes of hardening measuring tips.

The method further may include the step of: varying the kinetic energy of the electron beam while processing the measuring tip.

Varying the kinetic energy of the electron beam while processing the measuring tip may comprise varying the kinetic energy of the electron beam while scanning the electron beam over a tip of the measuring tip.

The choice of the kinetic energy of the electrons of the electron beam can set the location at which the electrons deposit a majority of their energy into the measuring tip.

The electron beam can comprise an energy in the range of 50 eV to 30 keV, preferably 50 eV to 20 keV, more preferably 50 eV to 25 keV, and most preferably 50 eV to 6 keV, and/or the electron beam can comprise a current of 1 pA to 100 nA, preferably 5 pA to 50 nA, more preferably 20 pA to 20 nA, most preferably 100 pA to 10 nA, and/or the beam diameter of the electron beam at the measuring tip can have a diameter of 1 nm to 100 nm, preferably 1.5 nm to 50 nm, more preferably 2 nm to 30 nm, and most preferably 2.5 nm to 15 nm.

A dwell time of the electron beam during scanning can comprise a time duration of 1 ns to 1 s, preferably 10 ns to 200 ms, more preferably 10 ns to 40 ms, and most preferably 15 ns to 20 ms, and/or a repetition time during scanning can comprise a time duration of 100 ms to 100 s, preferably 300 ms to 70 s, more preferably 1 s to 30 s, and most preferably 2 s to 10 s.

An area scanned by the electron beam can comprise an extent of 1000 μm×1000 μm, preferably 500 μm×500 μm, more preferably 100 μm×100 μm, and most preferably 25 μm×25 μm.

A scanning probe microscope can comprise: (a) a measuring tip with a tip; (b) a measuring head of the scanning probe microscope, which is embodied to align the tip of the measuring tip substantially in antiparallel fashion in relation to a direction of an energy beam; and (c) a device, which is embodied to direct the energy beam onto the tip of the measuring tip.

Here and elsewhere in this application, the expression "substantially" denotes an indication of a measurement variable within its error tolerances when the measurement variable is measured using measuring instruments in accordance with the prior art.

The scanning probe microscope can be embodied to carry out a method according to any one of the above-discussed aspects.

According to an even further exemplary embodiment of the present invention, the problem described in the preceding section is solved by a method for cleaning a measuring probe and/or for sharpening, thinning and/or cleaning a measuring tip within a scanning probe microscope, in which the method includes the following steps: (a) producing a plasma outside of the scanning probe microscope; and (b) providing the externally produced plasma at the location of the measuring probe within the scanning probe microscope for the purposes of cleaning the measuring probe and/or providing the externally produced plasma at the location of the measuring tip within the scanning probe microscope for the purposes of sharpening, thinning and/or cleaning the measuring tip.

A plasma contains partly charged components; normally, these are ions and electrons. The charged particles typically have great kinetic energy and recombine quickly. At the location of production, a low-pressure plasma contains a certain portion of charged particles, which may have disadvantageous effects on a specimen, for example a measuring probe or a sensitive measuring tip. On the one hand, the charged particles lead to significant heating of the specimen and, on the other hand, a sensitive specimen, such as, for instance, a measuring tip, may be damaged or even destroyed by the sputtering effect of the charged particles of the plasma, in particular by the ions of the plasma. In any case, a certain portion of the ions is installed in the specimen, resulting in a change of the specimen surface.

In addition to charged particles, radicals are also produced when a plasma is produced. The radicals of a plasma are predominantly lost by the slow process of deactivation.

The composition of the plasma at its location of production can only be controlled with great difficulties. The external production of a plasma opens up an additional degree of freedom when setting the composition of the plasma to which a measuring probe or a measuring tip or the measuring tips of a measuring tip carrier are exposed. As a result of the spatial separation of plasma source and specimen to be processed, for example, a measuring tip, it is possible to set the ratio of heating of the specimen, physical sputtering by the charged components of the plasma and chemical etching, which is preferably induced by the radicals of the plasma. Hence, a processing step for sharpening, thinning and/or cleaning a measuring tip can be adapted to its composition and configuration. By removing the traces of use of a measuring tip in a scanning probe microscope in controlled fashion, it is possible to restore a measuring tip to such an extent that it supplies measurement data like a new, unused measuring tip.

The provision of the externally produced plasma may comprise: guiding the externally produced plasma to the location of the measuring probe or of the measuring tip of the scanning probe microscope.

To this end, a line system or a pipe system connects an output of a plasma source with a reaction chamber of the scanning probe microscope.

Moreover, the method can include the step of: setting a portion of charged particles of the externally produced plasma at the location of the measuring probe or of the measuring tip by way of a difference between a pressure at the location of the measuring probe or of the measuring tip and a source pressure of a plasma source, a distance between the measuring probe or the measuring tip and the plasma source, and/or a cross section of a line system between the plasma source and the scanning probe microscope.

The spatial distance between the measuring probe or the measuring tip and the plasma source, the pressure difference between these locations and the geometry of the pipe system connecting the plasma source and the scanning probe microscope are important parameters for determining the transport duration of the particles of the plasma from the source to the measuring probe or measuring tip. Accordingly, these parameters have a decisive influence on the composition of the plasma at the location of the measuring probe or the measuring tip.

A source pressure of a plasma source can comprise a range from 0.05 Pa to 250 Pa. A pressure at the location of the measuring probe or the measuring tip prior to the activation of the plasma source may comprise a range of 1 Pa to $10^{-7}$ Pa, preferably 0.2 Pa to $10^{-6}$ Pa, more preferably of $10^{-1}$ Pa to $10^{-5}$ Pa, and most preferably of $10^{-2}$ to $10^{-4}$ Pa. A distance between the measuring probe or the measuring tip and an output of the plasma source can be 1 cm to 10 m, preferably 2 cm to 5 m, more preferably 5 cm to 2 m, and most preferably 10 cm to 1 m. A cross section of a pipe system may comprise an area of 1 $mm^2$ to 100 $cm^2$, preferably 1 $cm^2$ to 80 $cm^2$, more preferably 10 $cm^2$ to 60 $cm^2$, and most preferably 20 $cm^2$ to 40 $cm^2$.

On the one hand, it is expedient to select a cross section for the pipe system that is as small as possible, which consequently increases the concentration of the radicals at the location of the measuring tip. On the other hand, a small pipe cross section increases the interaction of the radicals with one another and with the walls of the pipe and thus reduces the concentration during the transport from the plasma source to the measuring tip. Therefore, it is necessary to find a compromise between these two contradictory trends for each plasma.

In one aspect, the portion of charged particles of the externally produced plasma is substantially zero at the location of the measuring probe or of the measuring tip.

In this case, only the radicals still present from the plasma production process cause etching of the measuring probe or the measuring tip. The radicals of the plasma, which are still present, do not develop a sputtering effect. Damage to the measuring probe or the measuring tip is largely avoided.

At the location of the measuring probe or the measuring tip, the externally produced plasma may comprise oxygen radicals, hydroxyl radicals, nitrogen monoxide radicals and/or nitrous oxide radicals. In the present application, radicals should be understood to mean atoms or molecules that have at least one unpaired valence electron.

The externally produced plasma can act at the location of the measuring tip for a time duration of 1 second to 100 minutes, preferably 5 seconds to 50 minutes, more preferably 20 seconds to 20 minutes, and most preferably 30 seconds to 10 minutes.

The measuring tip is typically carbon-based. Sharpening, thinning and/or cleaning of the measuring tip can be repeated once to ten times, preferably once to eight times, more preferably once to six times, and most preferably twice to five times.

A scanning probe microscope can comprise: (a) a measuring probe, a measuring tip and/or a measuring tip carrier with at least two measuring tips; (b) a plasma source, which is embodied to produce a plasma and which is arranged outside of the scanning probe microscope; and (c) a line system, which is embodied to guide the plasma produced by the plasma source into the scanning probe microscope.

Further, the scanning probe microscope may comprise a pump system, which is embodied to produce a predetermined negative pressure at the location of the measuring probe, the measuring tip and/or the measuring tip carrier.

In the present application, the term "negative pressure" denotes an absolute pressure specification with a numerical value that is lower than atmospheric pressure under normal conditions.

Moreover, the scanning probe microscope can have a control device, which is embodied to control the plasma source.

The scanning probe microscope can be embodied to carry out a method according to any one of the above-discussed aspects.

Finally, a computer program can comprise instructions which, if they are executed by a computer system of one of the scanning probe microscopes described above, cause the scanning probe microscope to perform the method steps from one of the aspects above.

DESCRIPTION OF DRAWINGS

The following detailed description describes currently preferred exemplary embodiments of the invention, with reference being made to the drawings, in which.

DETAILED DESCRIPTION

Below, currently preferred embodiments of methods according to the invention for extending the time period between two probe changes of a scanning probe microscope are explained in more detail using the example of a scanning force microscope or atomic force microscope (AFM). However, the methods according to the invention are not restricted to the examples discussed below. Instead, these can be used for any scanning probe microscope whose force sensor can detect an interaction between a specimen and a measuring tip of a scanning probe microscope, as a result of which the measuring tip is subject to wear, a plastic deformation and/or a contamination.

Figure 1:
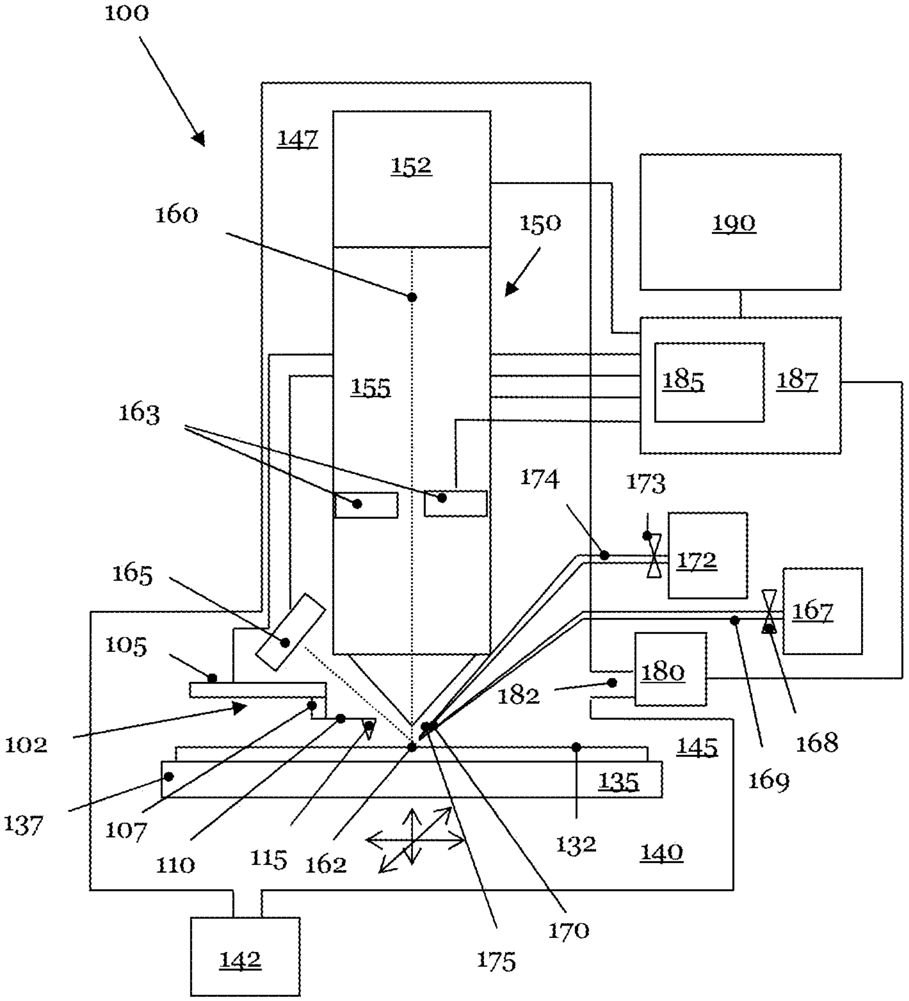
FIG. 1 shows a schematic section through a few important components of a scanning probe microscope, which comprises exemplary processing devices for hardening a measuring tip, and/or for irreversible processing, and/or for sharpening, cleaning and/or thinning a measuring tip and/or for cleaning a measuring probe.

A scanning probe microscope (SPM) containing various components that allow the time period of use of a measuring tip to be extended is described first. FIG. 1 shows a schematic section through some important components of a scanning probe microscope 100. In the example illustrated in FIG. 1, the scanning probe microscope 100 is a scanning force microscope or an atomic force microscope (AFM). However, the methods described below could also be used in a scanning tunneling microscope, for example.

A measuring head 102 is installed in the scanning probe microscope 100. The measuring head 102 comprises a holding apparatus 105. The measuring head 102 is fastened to the frame of the SPM 100 by use of the holding apparatus 105 (not shown in FIG. 1). The holding apparatus 105 can be rotated about its longitudinal axis which extends in the horizontal direction (likewise not shown in FIG. 1). A piezo-actuator 107 which facilitates a movement of the free end of the piezo-actuator 107 in three spatial directions (not illustrated in FIG. 1) is attached to the holding apparatus 105 of the measuring head 102. Fastened to the free end of the piezo-actuator 107, there is a bending bar 110 which is referred to as a cantilever 110 below, as is conventional in the art.

Figure 2:
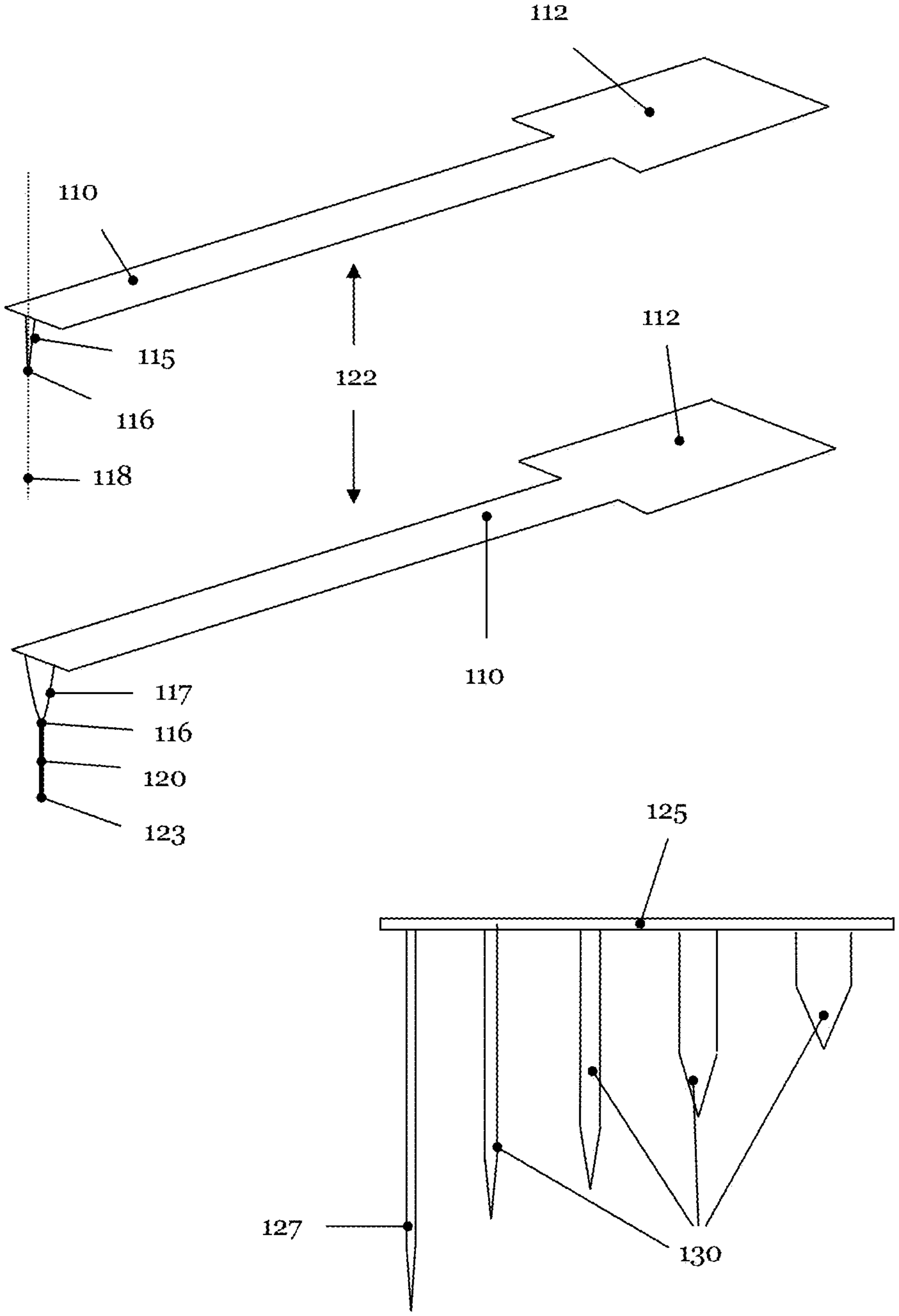
FIG. 2 schematically illustrates a probe comprising a measuring probe in the upper part, schematically presents a probe comprising a measuring tip in the central part and elucidates a schematic example of a measuring tip carrier with a first and four second measuring tips in the lower part.

As illustrated in schematically magnified fashion in the upper part of FIG. 2, the cantilever 110 has a holding plate 112 for attachment to the piezo-actuator 107. The end of the cantilever 110 distant from the holding plate 112 carries a measuring probe 115. The measuring probe 115 may have a pyramidal form.

The cantilever 110 and the measuring probe 115 may be configured in one piece. By way of example, the cantilever 110 and the measuring probe 115 may be manufactured from a metal, such as, for instance, tungsten, cobalt, iridium, a metal alloy or from a semiconductor, such as, for instance, silicon or silicon nitride. It is also possible to manufacture the cantilever 110 and the measuring probe 115 as two separate components and to subsequently connect these to one another. This can be effectuated by adhesive bonding, for example.

As illustrated in the central partial image of FIG. 2, a fine long measuring tip 120, which is also referred to as a whisker tip 120 below, is additionally deposited on the tip 116 of a measuring probe 117, which may have a different form to the measuring probe 115. Preferably, this is implemented by the provision of a carbon-containing precursor gas and by directing an electron beam onto the measuring probe 117 along the longitudinal axis 118 of the measuring probe 117. Then, the measuring tip 120 grows counter to the beam direction of the electron beam. The deposition of long column-like measuring tips 120 based on carbon is described in detail by the author K. I. Schiffmann in the article "Investigation of fabrication parameters of the electron-beam-induced deposition of contamination tips used in atomic force microscopy", which was already cited in the introductory part.

The methods for extending the use duration of measuring tips 120 of the scanning probe microscope explained below relate predominantly to whisker tips 120. However, as explained below, the described methods may also be used for cleaning conventional measuring probes 115. Unlike what is illustrated in FIG. 2, a measuring tip 120 need not be deposited on a measuring probe 115, 117; instead, a carbon-based measuring tip 120 may also be deposited directly on a cantilever 110.

In place of a single measuring tip 120, a measuring tip carrier 125, which has two or more measuring tips, may be attached to the cantilever 110. The lower part of FIG. 2 shows, in schematic and greatly magnified fashion, a section through a measuring tip carrier 125 which has five measuring tips, a first measuring tip 127 and four second measuring tips 130. The measuring tips 127 and 130 can be arranged on a measuring tip carrier 125 in any configuration. In addition to the linear configuration illustrated in FIG. 2, the measuring tips 127, 130 could also be arranged in circular fashion, for example. Moreover, the measuring tips 127, 130 could be arranged in a two-dimensional field.

As illustrated in the lower partial image of FIG. 2, the measuring tips 127 and 130 could be grown directly onto a measuring tip carrier 125. However, it is also possible to deposit the measuring tips 127 and 130 on measuring probes, for example on the tip of a pyramid, which serves as a measuring probe 115 (not illustrated in FIG. 2). In addition to the measuring tips 127 and 130, one or more measuring probes 115 and 117 can also be attached to the measuring tip carrier 125.

The combination of a cantilever 110 and a measuring probe 115, a cantilever 110 and a measuring tip 120 or a cantilever 110 and a measuring tip carrier 125 is referred to as probe 122 below. When a measuring probe 115, a measuring tip 120 or a measuring tip carrier 125 is changed, the corresponding probe 122 is always replaced.

With reference to FIG. 1, a specimen 132 to be examined is affixed to a specimen stage 135. By way of example, this can be implemented by placing the specimen 132 on bearing points of the specimen stage 135 in a vacuum or high vacuum environment or by an electrostatic interaction between the specimen stage 135 and an electrically conductive rear side of the specimen 132.

The specimen 132 may be an arbitrary microstructured component or structural part. By way of example, the specimen 132 may comprise a transmissive or a reflective photomask and/or a template for nanoimprint technology. Furthermore, the SPM 100 can be used for examining for example an integrated circuit, a microelectromechanical system (MEMS) and/or a photonic integrated circuit.

As indicated by arrows in FIG. 1, the specimen stage 135 can be moved by a positioning system 137 in three spatial directions relative to the measuring head 102 of the AFM 100. In the example in FIG. 1, the positioning system 137 is embodied in the form of a plurality of micromanipulators. An alternative embodiment of the positioning system 137 might be piezo-actuators. The positioning system 137 is controlled by signals of a control device 185. In an alternative embodiment, the control device 185 does not move the specimen stage 135, but rather the holding apparatus 105 of the measuring head 102 of the AFM 100. It is furthermore possible for the control device 185 to perform a coarse positioning of the specimen 132 in height (z-direction) and for the piezo-actuator 107 of the measuring head 102 to perform a precise height setting of the AFM 100. The control device 185 can be part of a computer system 187 of the scanning probe microscope 100.

As an alternative or in addition thereto, in a further embodiment, it is possible to divide the relative movement between the specimen 132 and the measuring probe 115 or the measuring tip 120 between the positioning system 137 and the piezo-actuator 107. By way of example, the positioning system 137 performs the movement of the specimen 132 in the specimen plane (xy-plane) and the piezo-actuator 107 facilitates the movement of the measuring tip 120 or, in general, of the probe 122 in the direction of the normal to the specimen (z-direction).

The exemplary scanning probe microscope 100 in FIG. 1 contains a modified scanning electron microscope (SEM) 150. An electron gun 152 produces an electron beam 160, which is directed as a focused electron beam 160 onto the specimen 132 at the location 162 by the imaging elements, not illustrated in FIG. 1, arranged in the column 155, said specimen being arranged on a specimen stage 135. Further, the imaging elements of the column 155 of the SEM 150 can scan the electron beam 160 over the specimen 132.

The electrons backscattered from the electron beam 160 and the secondary electrons generated by the electron beam 160 are registered by the detector 163. A detector 163 that is arranged in the electron column 155 is referred to as an "in lens detector." The detector 163 can be installed in the column 155 in various embodiments. The detector 163 is controlled by the control device 185. Further, the control device 185 of the SPM 100 receives the measurement data of the detector 163. The control device 185 can produce images from the measurement data and/or the data of the measuring head 102, said images being presented on a monitor 190.

As an alternative or in addition thereto, the scanning probe microscope 100 may have a detector 165 for backscattered electrons or for secondary electrons, said detector being arranged outside of the electron column 155. The detector 165 is likewise controlled by the control device 185.

In addition to imaging of the specimen 132, the electron beam 160 can also be used for imaging the measuring probe 115 and the measuring tip 120, 127, 130. For the purposes of imaging the measuring probe 115 or the measuring tip 120, 127, 130, the specimen stage 135 has no specimen so that the measuring probe 115 or the measuring tip 120, 127, 130 can be brought to the location 162. If necessary, the specimen stage 135 is additionally lowered in the z-direction. For the purposes of analyzing the measuring probe 115 or the measuring tip 120, 127, 130, the measuring head 102 of the SPM 100 is rotated about the longitudinal axis of the holding apparatus 105 of the measuring head 102. The rotation can be set to any angle between 0° and 360°. Rotating the measuring head 102 can be controlled by the control device 185 of the SPM 100.

Figure 3:
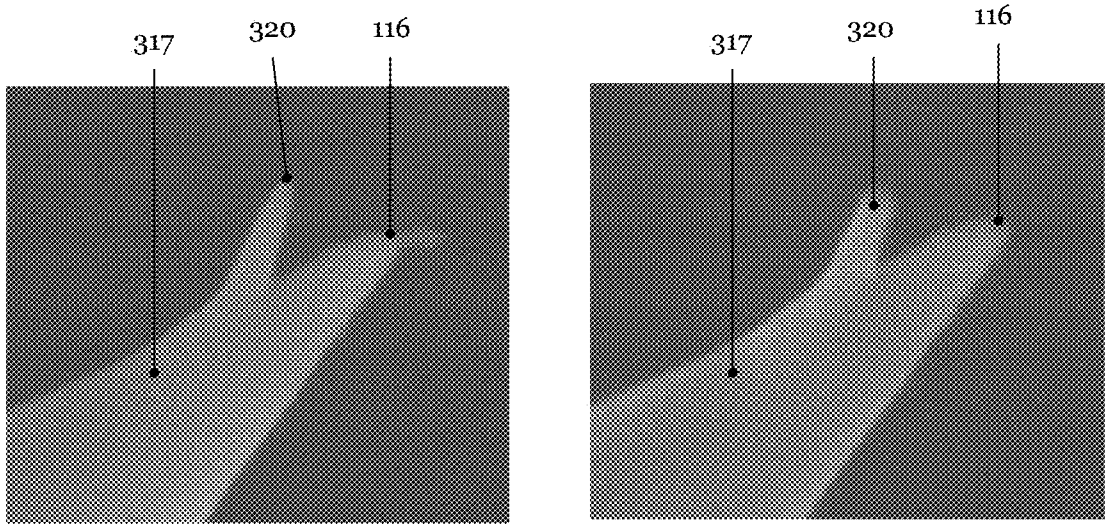
Fig. 3 (Prior Art)
FIG. 3 illustrates an unused measuring tip attached to a measuring probe in the left partial image and presents the combination of measuring probe and measuring tip of the left partial image after the measuring tip was used for scanning a specimen in the right partial image.

In addition to analyzing the measuring tip 120, 127, 130, the electron beam 160 of the SEM 150 can also be used to harden the measuring tip 120, 127, 130. In the left partial image, FIG. 3 shows a measuring probe 317 with a grown-on carbon-based measuring tip 320 according to the prior art. The measuring tip 320 is not deposited on the tip 116 of the measuring probe 317. The right partial image in FIG. 3 shows the measuring tip 320 of the measuring probe 317 after scanning the measuring tip 320 over the specimen 132. The carbon-based material of the measuring tip 320 is soft and subject to fast wear as a result thereof. In the right partial image of FIG. 3, the length of the measuring tip 320 has already been reduced to such an extent that the tip 116 of the measuring probe 317 and the tip 320 can simultaneously interact with a specimen 132 to be examined. In comparison with the unused measuring tip 320 of the left partial image of FIG. 3, the worn measuring tip 320 has a significantly reduced radius of curvature, which increases the smallest possible area in the interaction zone with a specimen. As a result, the spatial resolution of the measuring tip 320 is significantly reduced. Moreover—as already mentioned-there is a risk of the tip 116 of the measuring probe 317, in addition to the measuring tip 320, also interacting with the specimen 132. As a result, the data produced by means of a scan could become unusable. Moreover, there is a risk of a sensitive specimen 132 being damaged by the tip 116 of the measuring probe 317. Moreover, the evaluation of the measurement data can become more difficult on account of the ambiguous interaction between the measuring probe 317 and the specimen 132.

Figure 4:
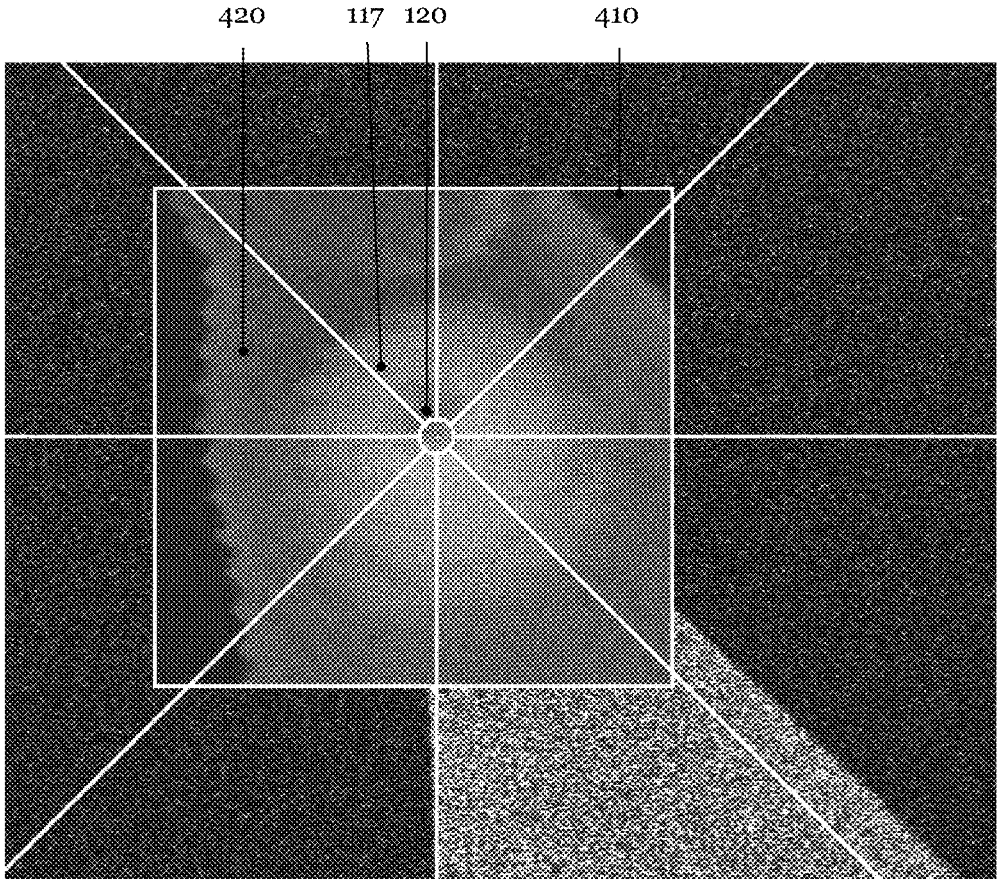
FIG. 4 shows a plan view of a scanning electron microscope recording of a measuring probe with a measuring tip deposited thereon.

FIG. 4 elucidates the scanning of the electron beam 160 of the SEM 150 over a measuring tip 120 and the surroundings of the measuring tip 120. The square 410 represents a magnified section of the measuring probe 117 and the measuring tip 120. Scanning the electron beam over the measuring tip 120 should densify the soft carbon-based material of the measuring tip 120, 127, 130 and harden the latter as a result. In the example illustrated in FIG. 4, the scan region of the electron beam 160, which comprises the measuring tip 120, 127, 130, is an area of approximately 250 nm×250 nm. The electrons of the electron beam 160 have a kinetic energy of 5 keV. The electron beam 160 was focused at the location 162 onto a spot with a diameter of 1 nm. The dwell time of the electron beam 160 at a location and the repetition time were 100 μs and 5 ms in the example illustrated in FIG. 4. The entire radiation process of the scan region 410 took 5 minutes. The SEM 150 is controlled or regulated by the control device 185. The numerical values specified here can be modified over a relatively large range without substantially changing the densification of the measuring tip 120, 127, 130 brought about by the irradiation. By way of example, the material of the measuring tip 120, 127, 130 can be densified with a kinetic energy of the electrons in the range of 20 to 50 keV. The process of densification ends when the produced measuring tip 120, 127, 130 has the structure of the corresponding crystal lattice. The material of the measuring tip 120, 127, 130 cannot achieve a higher density.

In the case of long measuring tips 120, it is expedient to adapt the focus and/or the energy of the electron beam 160 during the scanning over the measuring tip 120 to the local height of the measuring tip 120 in order to bring the energy deposition to the desired locations within the measuring tip 120, 127, 130.

Figure 5:
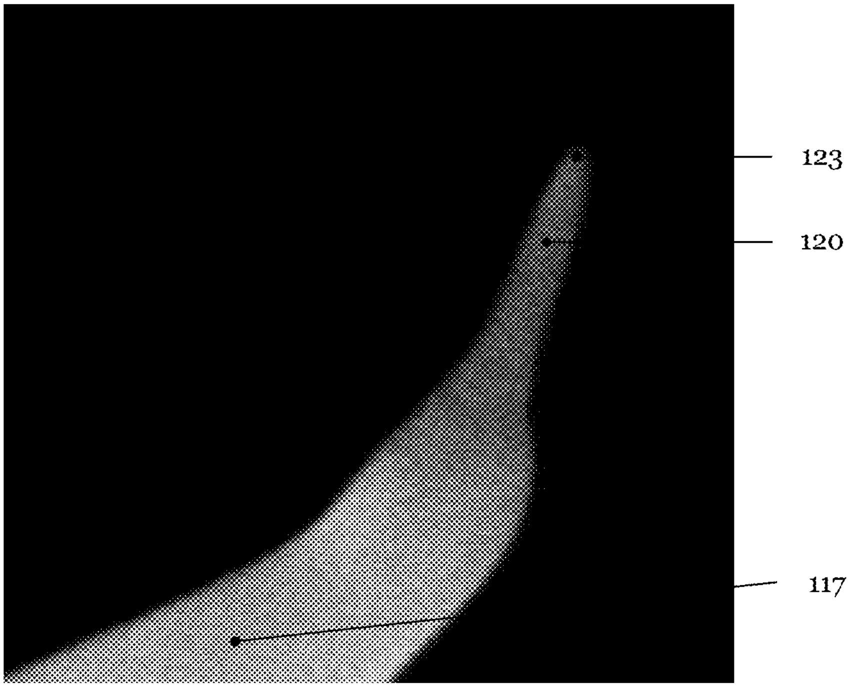
FIG. 5 illustrates a side view of a scanning electron microscope recording of a measuring probe with an unused measuring tip deposited thereon, wherein the measuring tip was hardened by electron irradiation.

FIG. 5 shows an image of the measuring tip 120 after the irradiation by the electron beam 160 for the purposes of hardening the measuring tip 120. The measuring probe 117 illustrated in FIG. 5 and the measuring tip 120 were analyzed after the irradiation process with the aid of the electron beam 160 of the SEM 150.

Figure 6:
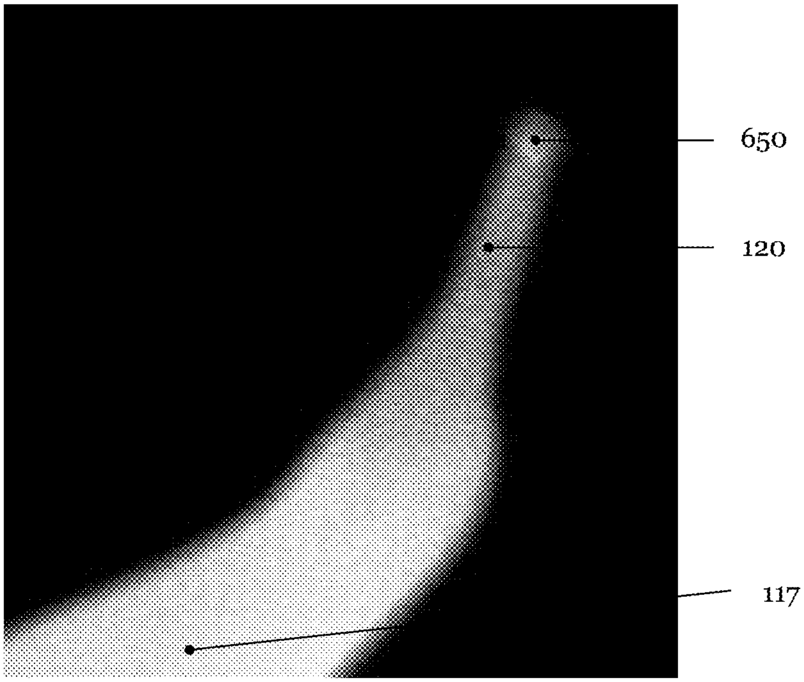
FIG. 6 shows the combination of measuring probe and measuring tip of FIG. 5 after a specimen was analyzed by the hardened measuring tip.

FIG. 6 shows a recording of the measuring tip 120 and of a part of the measuring probe 117 after carrying out a scan in the measuring head 102 of the AFM 100. The processing time of the measuring tip 120 of FIG. 5 was comparable to the processing time of the measuring tip 120 illustrated in FIG. 3. What can clearly be gathered from FIG. 6 is that the hardened measuring tip 120 of FIG. 6 has substantially no wear. Only at the tip of the measuring tip there is a bit of contamination 650. The comparison of the FIGS. 5 and 6 therefore provides evidence that the material of the measuring tip 120 can be densified and hence hardened by processing a carbon-based measuring tip 120 or whisker tip 120, and so a measuring tip 120 post-processed with an electron beam 160 allows a significantly longer processing time than a measuring tip 120 that has not been hardened by an electron beam.

The electrons of the electron beam 160 radiated onto the measuring tip 120 substantially emit their energy in interaction with the electrons of the atoms of the measuring tip 120. In this process, the electrons of the atoms of the measuring tip 120 can be excited such that inter-atomic bonds between the atoms of the measuring tip 120 can be broken in order to be subsequently reformed. When a bond is re-formed, an energetically more expedient configuration of the arrangement of the atoms of the measuring tip 120 will typically arise, which is denser and more stable than the initial configuration. By way of example, the energetically most expedient structure of a measuring tip 120 made of carbon has a crystal lattice in the form of a diamond structure.

Hardening of a measuring tip by irradiation with electrons is illustrated in FIGS. 4 to 6 using the example of a whisker tip 120. As can be gathered from FIGS. 5 and 6 in comparison with FIG. 3, hardening of whisker tips 120 with the electron beam 160 provides impressive results. However, it is also conceivable to densify, and hence harden, conventional measuring probes 115 with the aid of an electron beam 160. As explained above, a densifying process is possible for as long as the crystal lattice or parts of the crystal lattice of a conventional measuring probe 115 do not yet have the densest packing of the atoms of the respective crystal lattice.

In the example specified in FIGS. 4 to 6, the hardening of measuring tips 120, 127, 130 was carried out with the aid of an electron beam 160. This is advantageous since the SPM 100 contains an SEM 150 for analyzing a specimen 132. However, it is also possible to use an ion beam, an atom beam, a molecule beam and/or a photon beam for the purposes of hardening a measuring tip 120, 127, 130.

Figure 7:
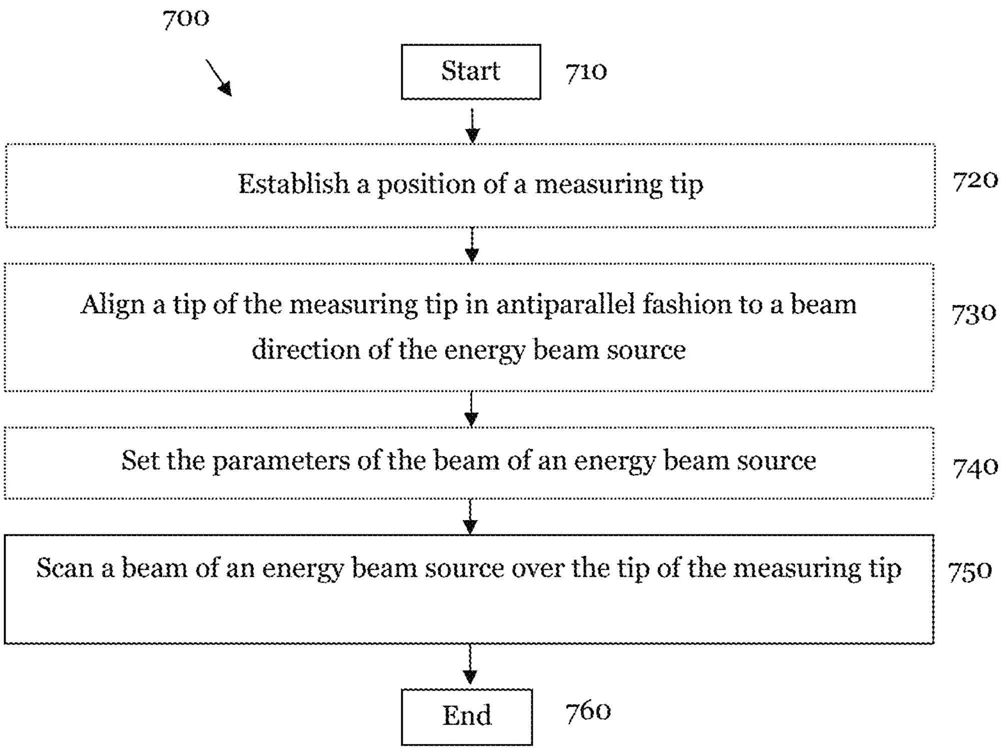
FIG. 7 reproduces a flowchart of a method for hardening a measuring tip with the aid of a beam of an energy beam source.

FIG. 7 presents a flowchart 700 for carrying out the above-described method. The method begins at 710. The first three steps 720, 730 and 740 are optional; therefore, the edging thereof is illustrated in dotted fashion in FIG. 7. The position of a measuring tip 120, 127, 130 is established in step 720. This can be carried out with the aid of the beam of an energy beam source, for example an electron source or an ion source, which is subsequently used for scanning the beam over the measuring tip for the purposes of hardening the measuring tip 120, 127, 130. However, it is also possible for the position of a measuring tip 120, 127, 130 to be established with the aid of another measuring appliance. It is also possible for the position of a measuring tip 120, 127, 130 to be retrieved from a memory of the control device 185. Thereupon, in step 730, the tip 123 of the measuring tip 120, 127, 130 is aligned in antiparallel fashion to the direction of the beam 160 of the energy beam source 152 by way of the measuring head 102 of the SPM 100. The parameters of the beam of the energy beam source 152 are set in step 740. Preferably, this step is carried out by the control device 185. In an alternative embodiment, the parameters of the beam 160 of the energy beam source 152 can be set manually. In step 750, the beam 160 of the energy beam source 152 is scanned over the measuring tip 120, 127, 130 and, preferably, the surroundings 420 of the measuring tip 120, 127, 130. The method ends in step 760.

With reference to FIG. 1 again, the electron beam 160 of the SEM 150 can also be used to process defects of a specimen 132 in addition to analyzing the specimen 132, a measuring probe 115 and a measuring tip 120, 127, 137 and hardening a measuring tip 120, 127, 130. In order to process the specimen 132, arranged on the specimen stage 135, i.e., to repair the defects of said specimen, the scanning probe microscope 100 comprises at least two supply containers 167 and 172 for two different processing gases. The first supply container 167 stores a first precursor gas, in particular a first carbon-containing precursor gas. By way of example, a metal carbonyl, for instance chromium hexacarbonyl, or a main group element alkoxide, such as TEOS, for instance, can be stored in the first supply container 167. With the aid of the precursor gas stored in the first supply container 167, absent material, for example absent absorber material of a photomask, can be deposited on the specimen 132.

The second supply container 172 stores an etching gas, which makes it possible to perform an electron-beam-induced etching process. Excess material can be removed from the specimen 132 with the aid of an electron-beam-induced etching process. An etching gas can comprise for example xenon difluoride ($XeF_2$), chlorine ($Cl_2$), oxygen ($O_2$), ozone ($O_3$), water vapor ($H_2O$), hydrogen peroxide ($H_2O_2$), dinitrogen monoxide ($N_2O$), nitrogen monoxide (NO), nitrogen dioxide ($NO_2$), nitric acid ($HNO_3$), ammonia ($NH_3$) or sulfur hexafluoride ($SF_6$).

Each of the supply containers 167 and 172 has its own control valve 168 and 173 in order to monitor or control the amount of the corresponding gas that is provided per unit time, i.e., the gas volumetric flow at the location 162 of the incidence of the electron beam 160 on the specimen 132 or on the cantilever 122 or measuring probe 115, 120, 127, 130. The control valves 168 and 173 are controlled and supervised by the control device 185. Using this, it is possible to set the partial pressure conditions of the gases provided at the processing location 162 or 116 for depositing a measuring tip 120, 127, 130 in a broad range.

Furthermore, in the exemplary scanning probe microscope 100 of FIG. 1, each supply container 167, 172 has its own gas feedline system 169 and 174, which ends with a nozzle 170, 175 in the vicinity of the point of incidence 162 of the electron beam 160 on the specimen 132 or on the measuring probe 115, 120, 127, 130.

In the example illustrated in FIG. 1, the valves 168 and 173 are arranged in the vicinity of the corresponding containers 167 and 172. In an alternative arrangement, the control valves 168 and 173 can be incorporated in the vicinity of the corresponding nozzles (not shown in FIG. 1). Unlike the illustration shown in FIG. 1 and without preference at the present time, it is also possible to provide one or more of the gases stored in the containers 167 and 172 non-directionally in the lower part of the vacuum chamber 140 or the reaction chamber 145 of the SPM 100. In this case, it would be expedient for the scanning probe microscope 100 to have installed a stop (not illustrated in FIG. 1) between the lower reaction space 145 and the upper part 147 of the SPM 100, which contains the column 155 of the SEM, which provides the focused electron beam 160, in order to prevent negative pressure that is too low in the part 147 of the SPM 100

The supply containers 167 and 172 can have their own temperature setting element and/or control element, which enable both cooling and heating of the corresponding supply containers 167 and 172. This makes it possible to store and in particular provide the carbon-containing precursor gas(es) and/or the etching gas(es) at the respectively optimum temperature (not shown in FIG. 1). Furthermore, the feed line systems 169 and 174 can comprise their own temperature setting elements and/or temperature control elements in order to provide all the processing gases at their optimum processing temperature at the point of incidence 162 of the electron beam 160 on the specimen 132 or on the measuring probe 115 or on the measuring tip 120, 127, 130 (likewise not indicated in FIG. 1). The control device 185 can control the temperature setting elements and the temperature control elements both of the supply containers 167, 172 and of the gas feed line systems 169, 174.

The scanning probe microscope 100 illustrated in FIG. 1 can be operated under ambient conditions or in a vacuum chamber 140. Implementing the methods explained below necessitates negative pressure in the vacuum chamber 140 relative to the ambient pressure. For this purpose, the SPM 100 in FIG. 1 comprises a pump system 142 for generating and for maintaining a negative pressure required in the vacuum chamber 140. With closed control valves 168 and 173, a residual gas pressure of $<10^{-4}$ Pa is achieved in the vacuum chamber 140 of the SPM 100. The pump system 142 can comprise separate pump systems for the upper part of the scanning probe microscope 100 for providing the electron beam 160 and the lower part 145 or the reaction space 145 (not shown in FIG. 1). Furthermore, the SPM 100 can comprise a suction extraction apparatus in the vicinity of the processing point 162 of the electron beam 160 in order to define a defined local pressure condition at the surface of the specimen 132 or at the location of the measuring probe 115 or the measuring tip 120, 127 130 (not illustrated in FIG. 1). The use of an additional suction extraction apparatus can largely prevent one or more volatile reaction products of the one or more carbon-containing precursor gases, which are not required for the local deposition of the deposit on the specimen 132 or the measuring probe 115, 120, 127, 130, from being deposited on the specimen 132, the cantilever 110 of the probe 122 or the measuring probe 115, 120, 127, 130 or in the vacuum chamber 140.

Moreover, the suction extraction apparatus can prevent particles that arise in an etching process from being deposited on the specimen 132 or the cantilever 110 of the probe 122, or from being distributed in the vacuum chamber 140 of the SPM 100. The function(s) of the pump system(s) 142 and of the additional suction extraction apparatus can likewise be controlled and/or monitored by the control apparatus 185.

As a result of the focusable electron beam 160 and a carbon-containing precursor gas that is storable in the supply container 167, the scanning probe microscope 100 of FIG. 1 is provided with the option of depositing a measuring tip 120, 127, 130 on a cantilever 110, a measuring tip carrier 125 or a substrate of the cantilever 110 or the measuring tip carrier 125. To this end, the measuring head 102 of the SPM 100 is rotated through 180° about a horizontal axis in relation to the analysis position of the measuring head 102 and brought to the location of incidence 162 of the electron beam 160 on the specimen 132, with no specimen 132 being present in the reaction space 145 of the SPM 100 when a carbon-based measuring tip 120 is deposited. In an alternative, currently preferred embodiment, the measuring tips 120, 127, 130 are produced in a separate installation away from the SPM 100. The measuring tips 120, 127, 130 are cleaned and/or re-sharpened in the scanning probe microscope 100.

Figure 8:
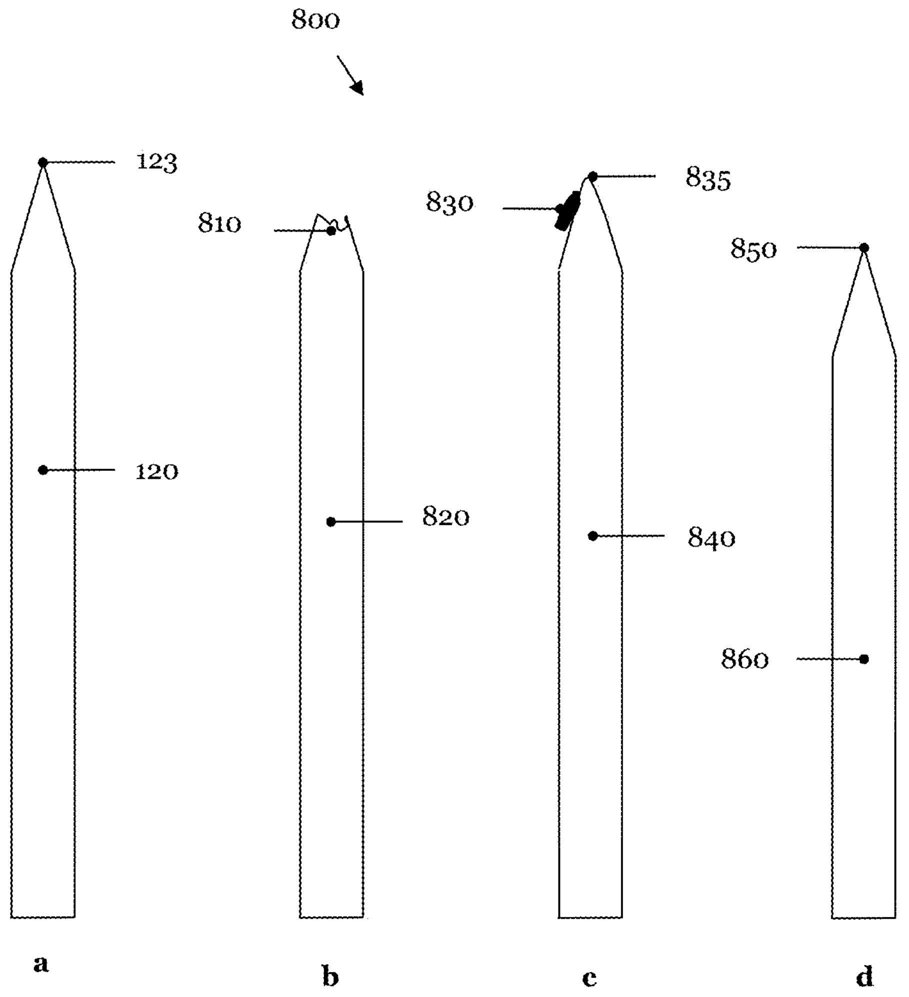
FIG. 8 shows an unused measuring tip in partial image a, reproduces a worn measuring tip in partial image b, illustrates a contaminated measuring tip in partial image c and shows a measuring tip repaired by an electron-beam-induced etching process in partial image d.

In partial image a, FIG. 8 shows a carbon-based measuring tip 120, which has a tip 123. The measuring tip 120 can be deposited directly on the cantilever 110, the measuring probe 117 or the measuring tip carrier 125. The measuring tip 120 has not yet analyzed any specimen 132. Partial image b presents the measuring tip 120 after use for examining a specimen 132. The tip 810 of the used measuring tip 820 has clear traces of use, which result in visible wear in comparison with the original tip 123. Partial image c likewise shows a used measuring tip 840. The tip 835 of the measuring tip 840 was only slightly rounded by the interaction with a specimen 132 and therefore subjected to little wear. However, a particle 830 has been deposited on the tip 835 of the measuring tip 840. The particle 830 changes the measurement data of the measuring tip 850 in comparison with the new measuring tip 120 of partial image a. However, it is also possible for the tip of a used measuring tip 820, 840 to both be a worn tip 810 and be contaminated (not illustrated in FIG. 8).

The damage to the measuring tips 820 and 840 of partial images b and c can be repaired by a local electron-beam-induced etching process using the electron beam 160 of the SEM 150 and an etching gas, which is stored in the supply container 172. Partial image d illustrates the repaired measuring tip 860. The contour of the tip 850 of the repaired measuring tip 860 is substantially the same as the contour of the tip 123 of the new, i.e., unused, measuring tip 120. Consequently, the repaired measuring tip 860 supplies substantially the same measurement data as the new measuring tip 120. The only difference between the two measuring tips 120 and 860 lies in the slightly shorter length of the repaired measuring tip 860.

Figure 9:
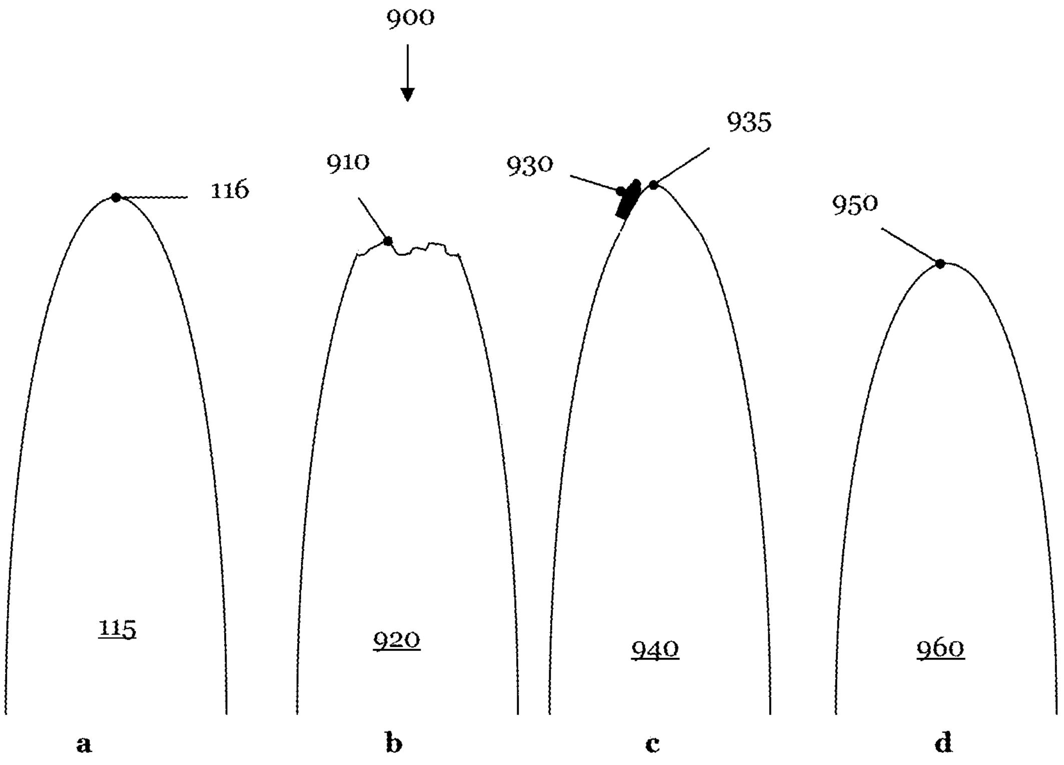
FIG. 9 shows an unused measuring probe in partial image a, reproduces a worn measuring probe in partial image b, elucidates a contaminated measuring probe in partial image c and illustrates a measuring tip repaired by an electron-beam-induced etching process in partial image d.

An electron-beam-induced etching process for repairing a carbon-based measuring tip 120 was explained in the context of FIG. 8. FIG. 9 elucidates that the SEM 150 of the SPM 100 can also be used to repair conventional measuring probes 115. The partial image a of FIG. 9 shows a section through a new measuring probe 115 and the tip 116 thereof in a schematic and greatly magnified fashion. Partial image b of FIG. 9 presents a used measuring probe 920, the tip 910 of which was worn down by the interaction with a specimen 132. The resolution of the used measuring probe 920 is poorer than that of the measuring probe 115. Partial image c shows the used measuring probe 940. The tip 935 thereof only shows small traces of use. However, a particle 930 was deposited on the tip 935, said particle causing a deterioration in the image data of the images supplied by the measuring probe 940.

Partial image d of FIG. 9 presents the repaired measuring probe 960. A contour of the tip 950 of the repaired measuring probe 960 that substantially corresponds to the contour of the tip 116 of the new measuring probe 115 was produced with the aid of the electron beam 160 of the SEM 150 and an etching gas stored in the supply container 172. The only difference between the two measuring probes 115 and 960 lies in the slightly reduced length of the repaired measuring probe 960.

Referring to FIG. 1 again, the scanning probe microscope 100 comprises a plasma source 180, which is flanged to the reaction chamber 145 of the SPM 100 via a line system 182 or a pipe system 182. The exemplary plasma source 180 of FIG. 1 produces a plasma by inductive excitation. There are many technical possibilities for producing a plasma, such as, for instance, an excitation by a DC voltage, by a capacitive electrical excitation, by microwaves or by laser radiation. The type of plasma excitation is not important for the subsequent excitation. A plasma can be described as a state of a gas in which charged particles, i.e., ions and electrons, excited particles, i.e., radicals and frequently atoms and molecules as well, exist next to one another in their ground state. The interaction of the plasma particles with the surface of a specimen in the form of a solid produces three fundamental effects: (I) the specimen is heated by irradiation with the fast electrons of the plasma; (II) the high-energy ions of a plasma exert a sputtering effect on a surface of the specimen; and (III) the radicals of the plasma etch the surface of a specimen (see J. T. Grant, S. D. Walck, F. J. Scheltens, und A. A. Voevodin: "Surface science aspects of contamination in TEM sample preparation," in: Specimen Preparation for Transmission Electron Microscopy of Materials—IV, Edit.: R. M. Anderson and S. D. Walck, Mater. Res. Soc. Symp. Proc. 480 (1997), p. 49-71). The combination of the three interactions of plasma particles with a specimen produces high material ablation rates on the specimen exposed to the plasma. However, the action of the charged particles, which have high kinetic energy, may damage or even destroy a sensitive specimen. Moreover, the introduction of ions of a plasma modifies the surface of a specimen up to a depth of a few nanometers.

Ions and electrons in the plasma are lost by way of recombination within the plasma or at the walls of the plasma chamber of the plasma source 180. The recombination processes occur on a short timescale (in the range of $10^{-8}$ s to $10^{-10}$ s). The excited particles of a plasma, i.e., the radicals, return to their ground state by the emission of their excitation energy. These deactivation processes occur on a longer timescale (in the range of $10^{-2}$ s to $10^{-4}$ s).

Plasmas are often used to clean surfaces on account of the above-described interactions with a specimen. Consequently, a plasma can be used to clean the measuring probe 940 that has been contaminated by use. In order to avoid the disadvantageous effects of the charged particles on the measuring probe 940 and, in particular, on the sensitive measuring tip 840, the contaminated measuring probe 940 and the contaminated measuring tip 840 are not exposed to the plasma where the latter is created. Instead, the plasma produced by the plasma source 180 is guided into the reaction space 145 of the SPM 100 by the pipe system 182. The composition of the plasma changes along the path from the output of the plasma source 180 to the location 162 at which the measuring probe 940 or the measuring tip 840 is situated.

The composition of the plasma at the location 162 can be set by way of the length of the distance between the output of the plasma source 180 and the location 162, by way of the pressure difference between these two positions and by way of the diameter of the pipe system 182. In the example of FIG. 1, the pipe system 182 has a round pipe with a length of 1 cm and a diameter of 0.5 cm. The distance between the inlet nozzle of the reaction chamber 145 and the location 162 is approximately 40 cm in the example of FIG. 1. Prior to the activation of the plasma source 180, there is a pressure of $10^{-2}$ Pa to $10^{-4}$ Pa at the location 162.

In the example illustrated in FIG. 1, the pipe system 182 only bridges the distance between the plasma source 180 and the wall of the reaction chamber 145 of the SPM 100. However, it is also possible to guide the pipe system into the vicinity of the location 162 in order to concentrate the plasma at the location of the measuring probe 940 or the measuring tip 840. Here, the pipe system can have a diameter in the range of approximately 1 mm to 2 cm and can comprise a length in the range of 10 cm to approximately 100 cm. The optimum of the two parameters should be established experimentally for a specific plasma.

The plasma source 180 uses air to produce the plasma. Important excited components of the produced plasma are oxygen (O) radicals, nitrogen monoxide (NO) radicals, dinitrogen monoxide ($N_2O$) radicals and OH* radicals. Alternatively, pure oxygen ($O_2$) can be used to generate the plasma. An inert gas, such as, for instance, argon or neon, can be added to the gas that is used to produce the plasma. The pressure of the plasma at the output of the plasma source 180 can be set over a range of 0.5 Pa to 250 Pa. The RF power of the plasma source 180 can be varied between 10 W and 99 W. Consequently, the intensity of the produced plasma can be modified over a large range.

Figure 10:
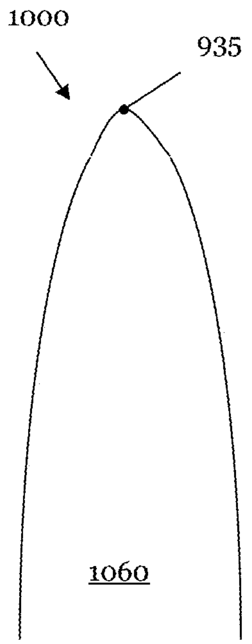
FIG. 10 presents the measuring tip of partial image c in FIG. 9 after cleaning by a plasma produced externally to the scanning probe microscope.

In the case of the geometry parameters specified above, the ions and the electrons from the plasma produced by the plasma source 180 have substantially disappeared at the location 162 as a result of relaxation. The radicals of the plasma of the plasma source 180 develop their etching effect at the location 162 of a measuring probe 940 or a measuring tip 820, 840. Hence, on the one hand, the contaminated measuring probe 940 can be cleansed of the particle 930. FIG. 10 reproduces the measuring probe 940 of FIG. 9 after the action of the radicals of the plasma produced by the plasma source 180. The diagram 1000 of FIG. 10 shows the measuring probe 940 of FIG. 9 after the latter was cleaned with a plasma for 5 minutes. The cleaning effect of the plasma has completely removed the particle 930 from the tip 935 of the measuring probe 940. The contour of the cleaned measuring tip 1060 was left substantially unchanged by the etching effect of the plasma. The cleaning process works particularly well for particles that are attacked more strongly by the radicals than the measuring tip 120, 127, 130 itself is. Moreover, it is expedient if the radicals can produce volatile products from the material of the particle or particles. By way of example this applies to carbon-based particles. By contrast, measuring tips 120, 127, 130 which are based on silicon or chromium are hardly attacked by the radicals of the plasma source. The plasma source 180 was operated with an RF power in the range of 20 W to 50 W. The source pressure of the plasma was 10 Pa.

Figure 11:
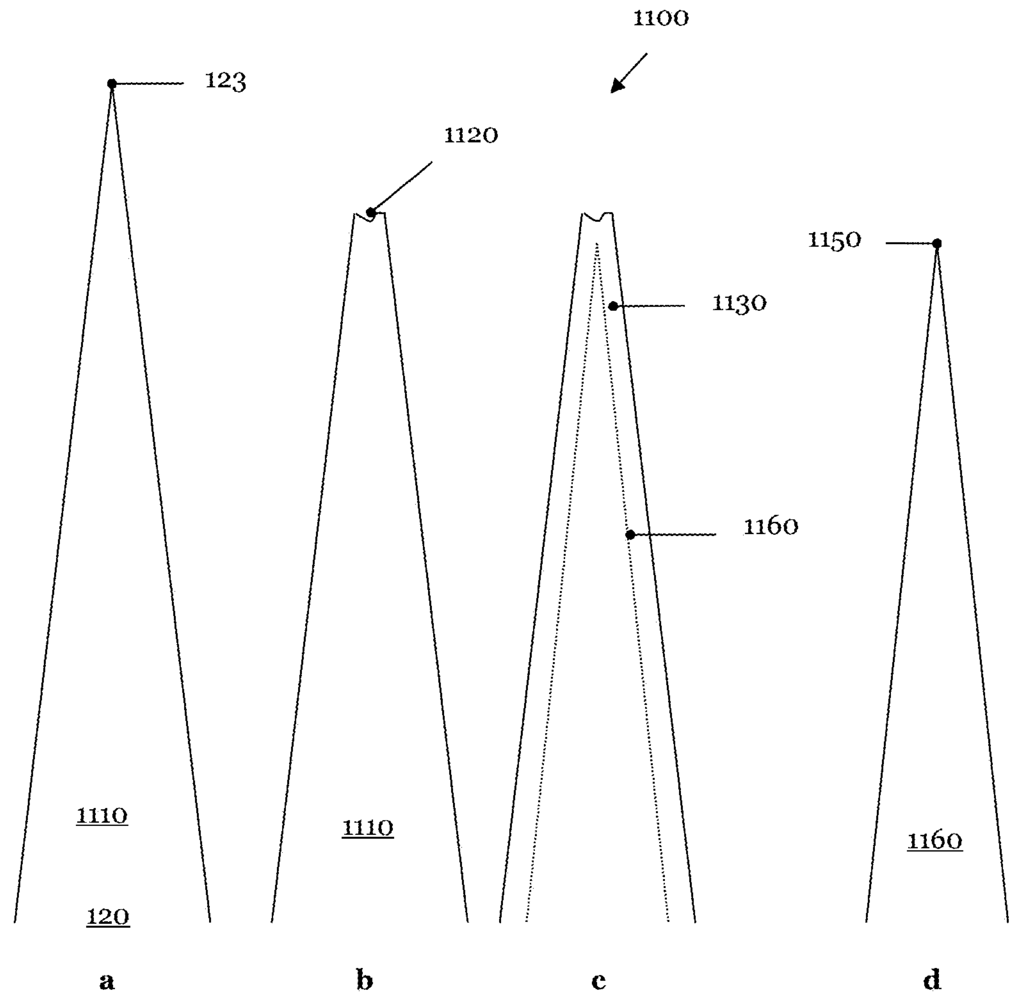
FIG. 11 shows the sharpened part of an unused measuring tip in partial image a, reproduces a worn tip of the sharpened part in partial image b, elucidates an isotropic material ablation of the sharpened part of partial image b by the etching effect of a plasma in partial image c and presents the repaired sharpened part of the measuring tip of partial image b in partial image d, wherein the repair was carried out by the action of a plasma that brings about a substantially isotropic etching process.

The etching effect of the radicals of the plasma produced by the plasma source 180 has a different effect on a carbon-based measuring tip 120, 127, 130 than on a measuring probe 115, 117 containing semiconducting or metallic material. Partial image a of FIG. 11 schematically shows the sharpened part 1110 of an unused measuring tip 120 or of a measuring tip 127, 130. The sharpened part 1110 has the tip 123. Partial image b presents the tip 1120 of the sharpened part 1110, which arose from the tip 123 as a result of using the measuring tip 120, 127, 130. The interaction between the specimen 132 and the measuring tip 120 has significantly worn down the tip 1120 of the latter. The action of the radicals of the plasma isotropically ablates material from the carbon-based sharpened part 1110 of the measuring tip 120. This means that the plasma produced by the plasma source homogeneously etches the sharpened part 1110 of the measuring tip 120. The wear at the tip 1120 disappears as a result of the isotropic material ablation by the plasma. As illustrated in partial image d of FIG. 11, the tip 1150 of the repaired sharpened part 1160 is substantially identical to the unused tip 123. However, the repaired, sharpened part 1160 is shorter than the original, sharpened part 1110 of the measuring tip 120. In the case of an RF power of 50 watts and a source pressure of 10 Pa, a material ablation rate of 0.2 nm/min arises for the aforementioned geometric configuration.

In partial images a, b and c, FIG. 12 once again repeats partial images a, b and c of FIG. 8. That is to say, partial image a once again illustrates a new measuring tip 120 or 127 or 130 with a sharpened part 1110 and a tip 123. Partial image b shows a tip 810 of the measuring tip 820 that has been worn through use and partial image c presents the measuring tip 840, the tip 835 of which has a particle 830. As illustrated in partial image d of FIG. 12, the etching effect of the radicals of the plasma produced by the plasma source 180 repairs the measuring tips 820 and 840. The particle removed from the tip 835 by the action of the plasma is extracted by suction from the reaction chamber 145 by the suction extraction system of the SPM 100, which is placed in the vicinity of the location 162. In an alternative embodiment, the extraction suction system additionally attached in the reaction chamber 145 is deactivated during the operation of the plasma source 180 in order to minimize the plasma loss at the location 162.

The tip 1250 of the repaired measuring tip 1260 substantially has the form of the tip 123. Depending on the form of the measuring tip 120, 127, 130, the explained process can be repeated multiple times. Consequently, the service life of carbon-based whisker tips 120, 127, 130 can be significantly increased by repairing used measuring tips 820 and 840 by the action of a plasma.

In comparison with the new measuring tip 120, the repaired measuring tip 1260 has two differences: firstly, the repaired measuring tip 1260 is shorter than the new measuring tip 120 and, secondly, the repaired measuring tip is thinner than the original measuring tip 120 as a result of the isotropic etching effect of the plasma. This means that, in addition to the removal of traces of use on the measuring tips 820 and 840, a plasma can also be used for targeted thinning or tapering of new measuring tips 120. As a result, in situ measuring tips 120, 127, 130 can be tailored for certain fields of use, for example for scanning trenches with a large aspect ratio.

Figure 13:
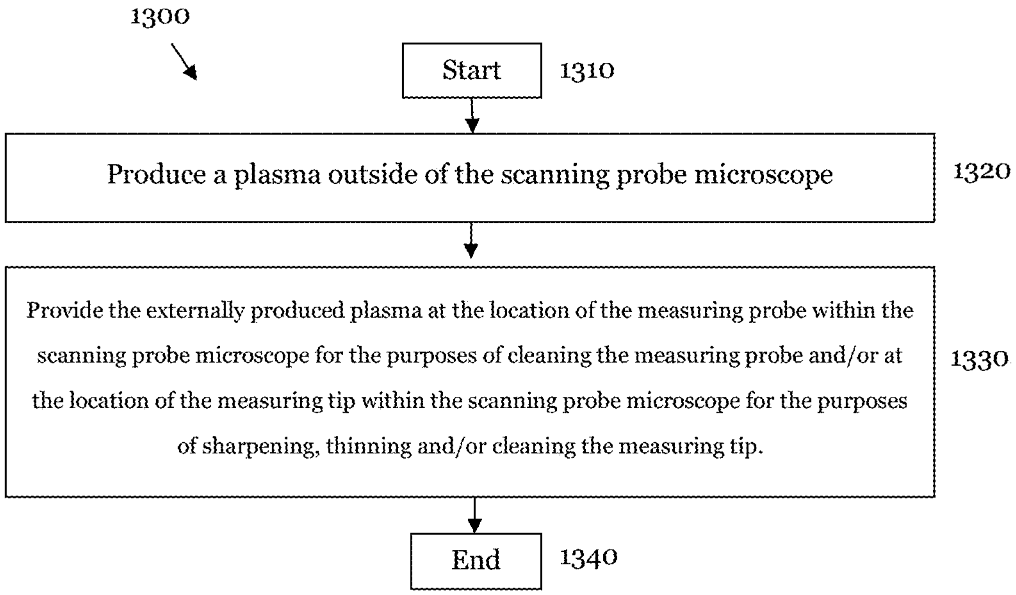
FIG. 13 reproduces a flowchart of a method for cleaning a measuring probe or for sharpening, cleaning and/or thinning a measuring tip with the aid of a plasma.

FIG. 13 reproduces a flowchart 1300 of a method that can be used to clean a measuring probe 115 or to sharpen, clean and/or thin a measuring tip 120, 127, 130 within a scanning probe microscope 100. The method begins at 1310. A plasma is produced outside of the scanning probe microscope 100 in the first step 1320. Thereupon, in the second step 1330, the externally produced plasma is provided at the location 162 of the measuring probe 115 within the scanning probe microscope 100 for the purposes of cleaning the measuring probe 115 or the externally produced plasma is provided at the location 162 of the measuring tip 120, 127, 130 within the scanning probe microscope 100 for the purposes of sharpening, cleaning and/or thinning the measuring tip 120, 127, 130. Finally, the method ends in step 1340.

Figure 14:
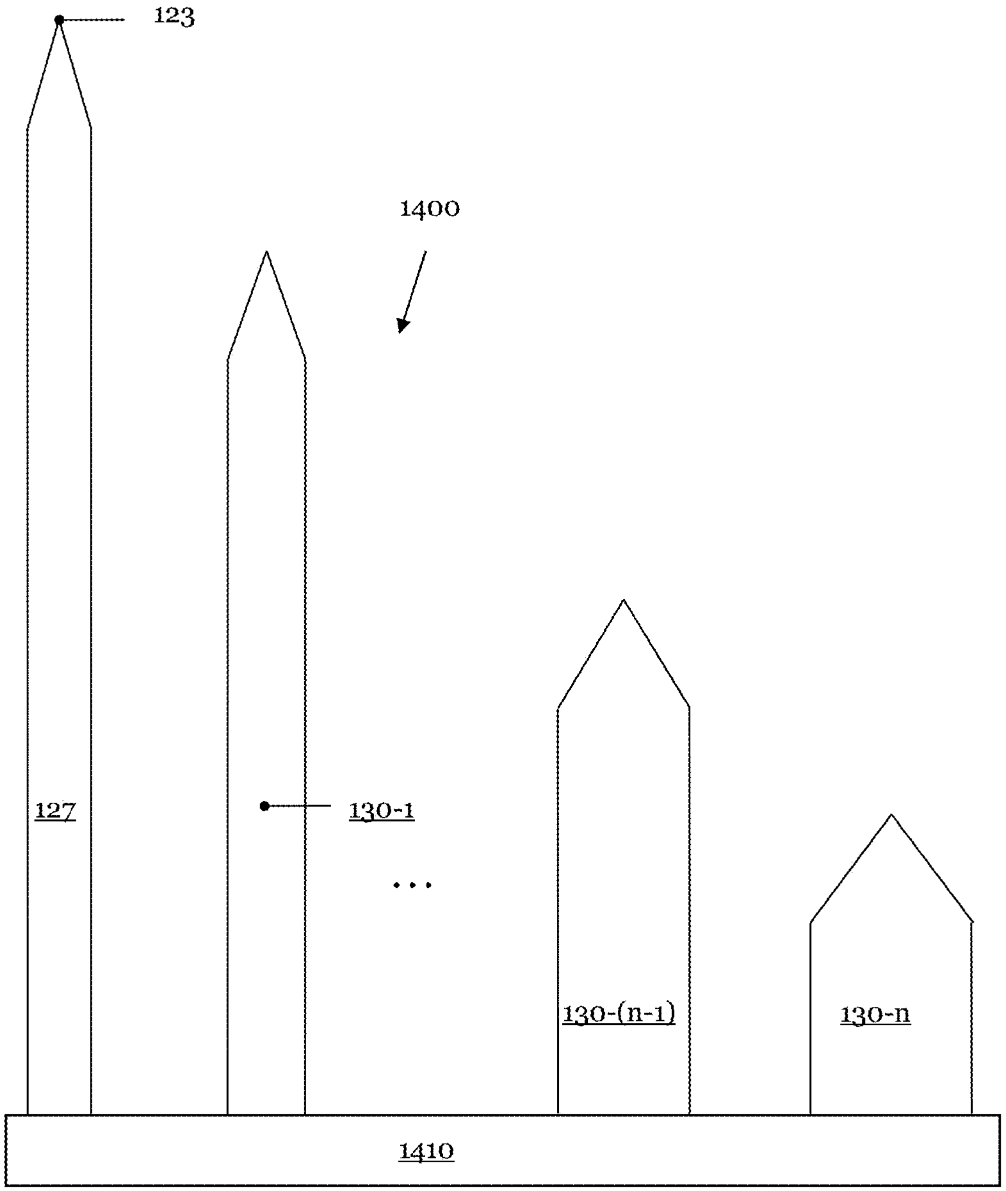
FIG. 14 specifies a section through a schematic illustration of a measuring tip carrier, which has a first measuring tip and n second measuring tips.

The diagram 1400 of FIG. 14 schematically shows a section through a measuring tip carrier 1410, which has (n+1) measuring tips. The measuring tip carrier 1410 can comprise a semiconducting material, for example from silicon (Si), a compound semiconductor, such as, for instance, silicon nitride ($Si_3N_4$) or gallium arsenide (GaAs), of metal, for instance titanium, or a metal alloy. Taking account of stabilization aspects, the thickness of the measuring tip carrier 1410 is chosen to be as thin as possible in order to keep the mass to be moved by the cantilever 110 low, and it typically lies in the submicrometer range.

The measuring tip carrier 1410 comprises a first measuring tip 127 and n second measuring tips 130-1 to **130-*n*. The first measuring tip 127 has a length of $(n+1)\cdot\Delta l$. Here, n+1 denotes the number of measuring tips 127, 130 on the measuring tip carrier 1410. Δl denotes the length difference between adjacent measuring tips 127, 130 on the measuring tip carrier. The length difference Δl is at least as large as the expected structure depth of the specimen to be examined. By way of example, for Δl=80 nm, the second measuring tip 130-1 is approximately 200 nm shorter than the first measuring tip 127 and its diameter is Δl greater than that of the first measuring tip 127. The further second measuring tips 130-2 to 130-*n* are produced in such a way that, firstly, their lengths are shorter in each case by a fixed amount, for example by 200 nm, and, secondly, their diameters increase by a predetermined value, such as, for instance, Δl, in comparison with the next longer second measuring tip 130**-(n−1).

The measuring tips 127, 130 can be arranged in any configuration on the measuring tip carrier 1410 provided that the lateral distances of adjacent measuring tips 127, 130 are observed. By way of example, the measuring tips 127, 130 can be deposited in a square configuration on the measuring tip carrier 1410.

As a result of this definition, n has a minimum value of one. The maximum value is given by the size of the measuring tip carrier 1410 which can be fastened to a cantilever 110 and the distance of the individual measuring tips 127 and 130. The measuring tip carrier can have a size in the region of 1 μm×1 μm. The measuring tips 127 and 130 can be deposited with a lateral spacing of approximately 300 nm. Hence, the maximum number of measuring tips 127 and 130 that can be carried by a measuring tip carrier 1410 lies in the two-digit range. Thus, for example, 4×4 measuring tips can be arranged in the example of a 1 μm×1 μm-sized measuring tip carrier 1410. By way of example, a measuring probe, for instance in the form of a truncated measuring probe, can be used as a measuring tip carrier, onto which an arrangement or an array of measuring tips can be grown.

As explained in the context of FIGS. 4 to 6 for an individual measuring tip 120, it is also conceivable to irradiate the measuring tips 127 and 130 of the measuring tip carrier 1410 with an electron beam, and hence harden said measuring tips, prior to the first application for analyzing a specimen 132. As a result, the service life of the first 127 and the second measuring tip 130 is increased.

Figure 15:
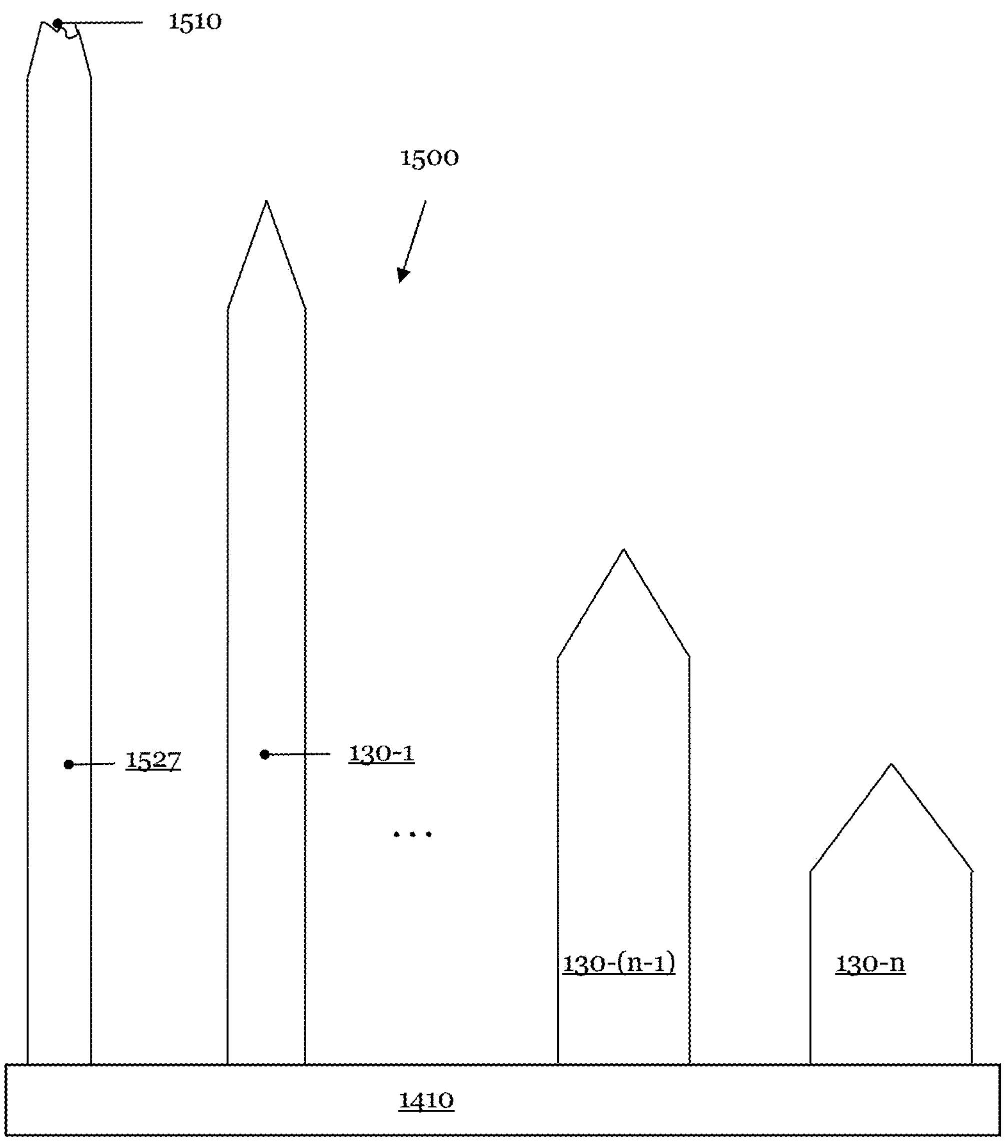
FIG. 15 illustrates the measuring tip carrier of FIG. 14 after its first measuring tip was used to examine a specimen.

The diagram 1500 in FIG. 15 shows the first measuring tip 1527 of the measuring tip carrier 1410 after the first measuring tip was used to examine the specimen 132. Similar to what was discussed in the context of FIGS. 8 and 12, the first measuring tip 1527 exhibits wear of its tip 1510 as a result of the interaction with the specimen 132. Alternatively, the measuring tip 123 of the original, first measuring tip 127 could be contaminated as a result of analyzing the specimen 132 (not illustrated in FIG. 15). Further, in addition to wear on the tip 1510, the first measuring tip 1527 could be additionally contaminated (not shown in FIG. 15).

Figure 12:
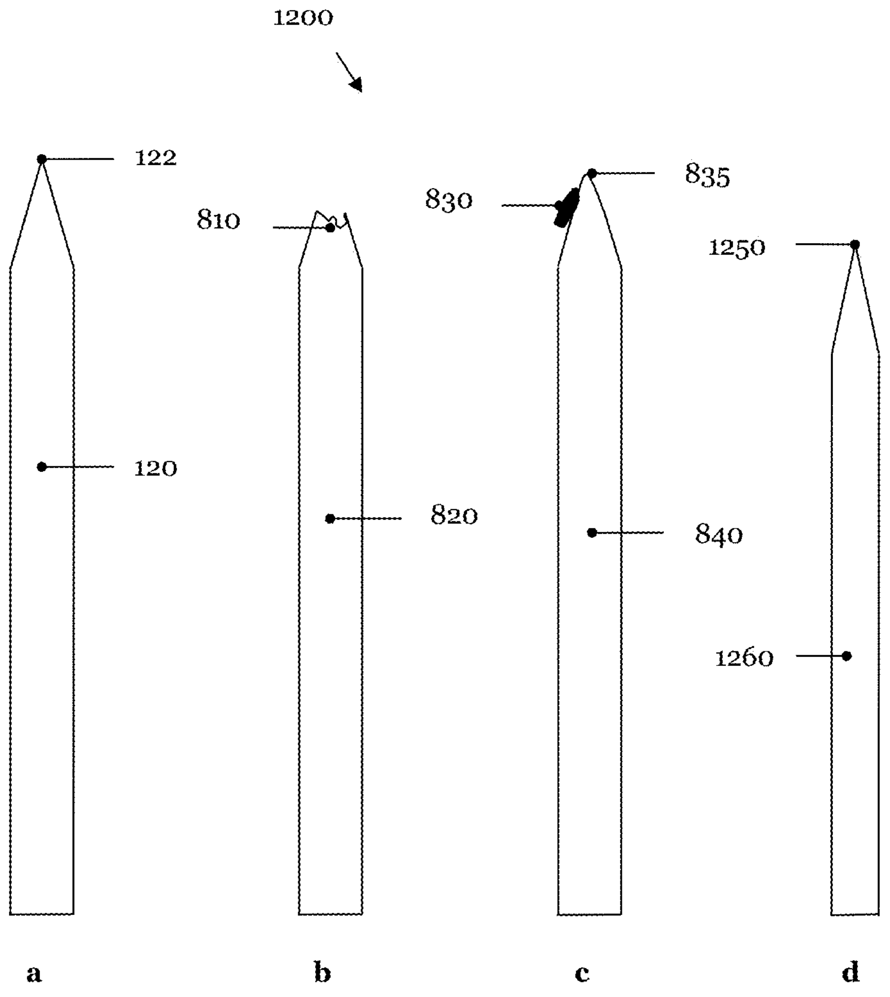
FIG. 12 shows an unused measuring tip in partial image a, reproduces a worn measuring tip in partial image b, elucidates a contaminated measuring tip in partial image c and represents a measuring tip repaired by a plasma-induced etching process in partial image d.
Figure 16:
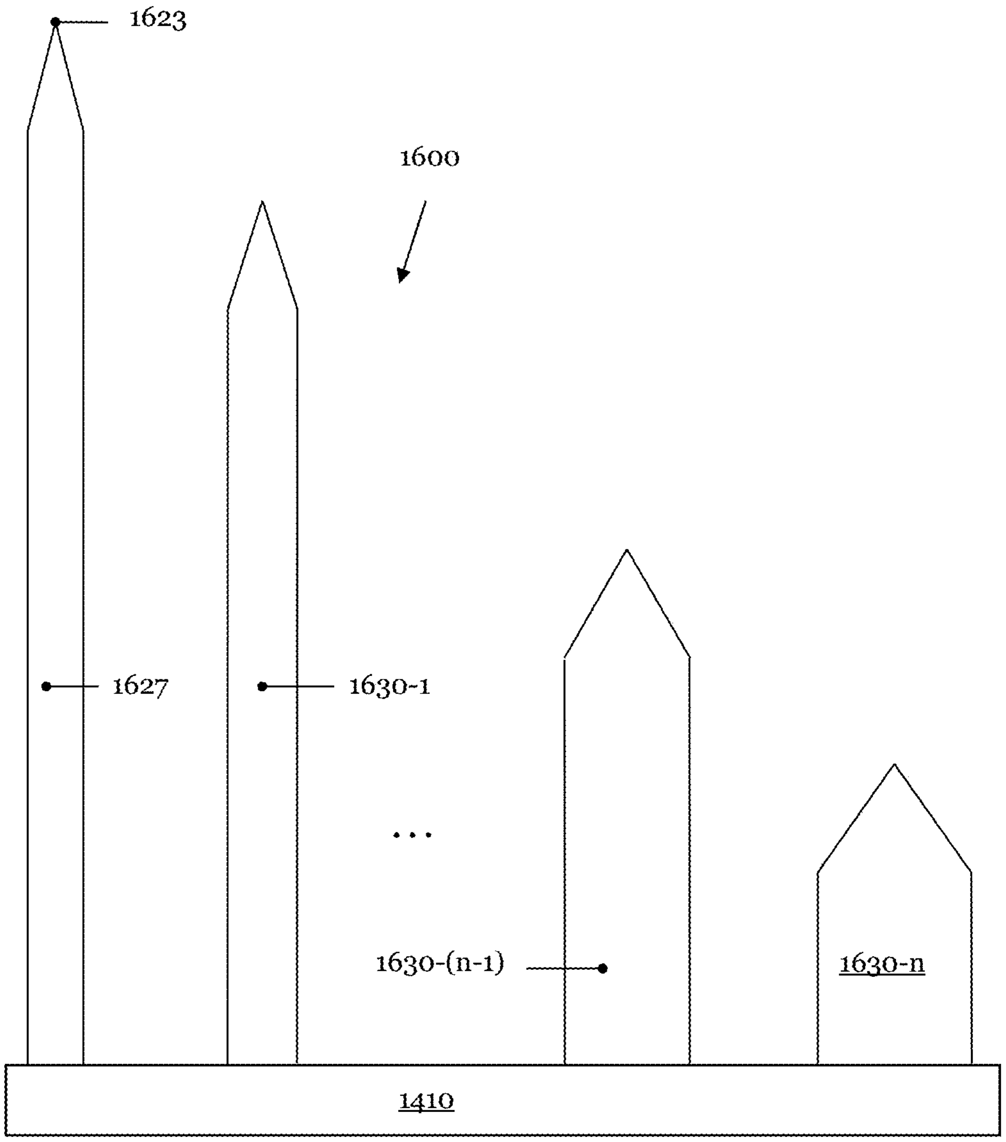
FIG. 16 shows the measuring tip carrier of FIG. 15 after its first measuring tip was repaired by the action of a plasma.

As already explained in the discussion relating to FIG. 12, the traces of use of the first measuring tip 1527 in the form of the worn measuring tip 1510 and/or a contaminated measuring tip 1527 could be repaired with the aid of a plasma that is produced by the plasma source 180. The diagram 1600 in FIG. 16 presents the measuring tip carrier 1410 after the action of the plasma. The repaired first measuring tip 1627 has a tip 1623 that substantially cannot be distinguished from the tip 123 of the new first measuring tip 123. As likewise explained in the context of FIG. 12, the repaired first measuring tip 1627 is shorter and thinner than the new first measuring tip 120. Moreover, the isotropic etching effect of the plasma produced by the plasma source 180 has likewise slightly shortened and thinned the second measuring tips 1630-1 to **1630-*n***.

Thinning of the first measuring tip 127 and the second measuring tips(s) could be avoided if the worn and/or contaminated first measuring tip 1527 is repaired using an electron-beam-induced etching process, which was described on the basis of FIG. 8, instead of a plasma etching process. This could avoid the second, shorter measuring tips 130 having to be made thicker than the first measuring tip 127 (not illustrated in FIG. 16).

Figure 17:
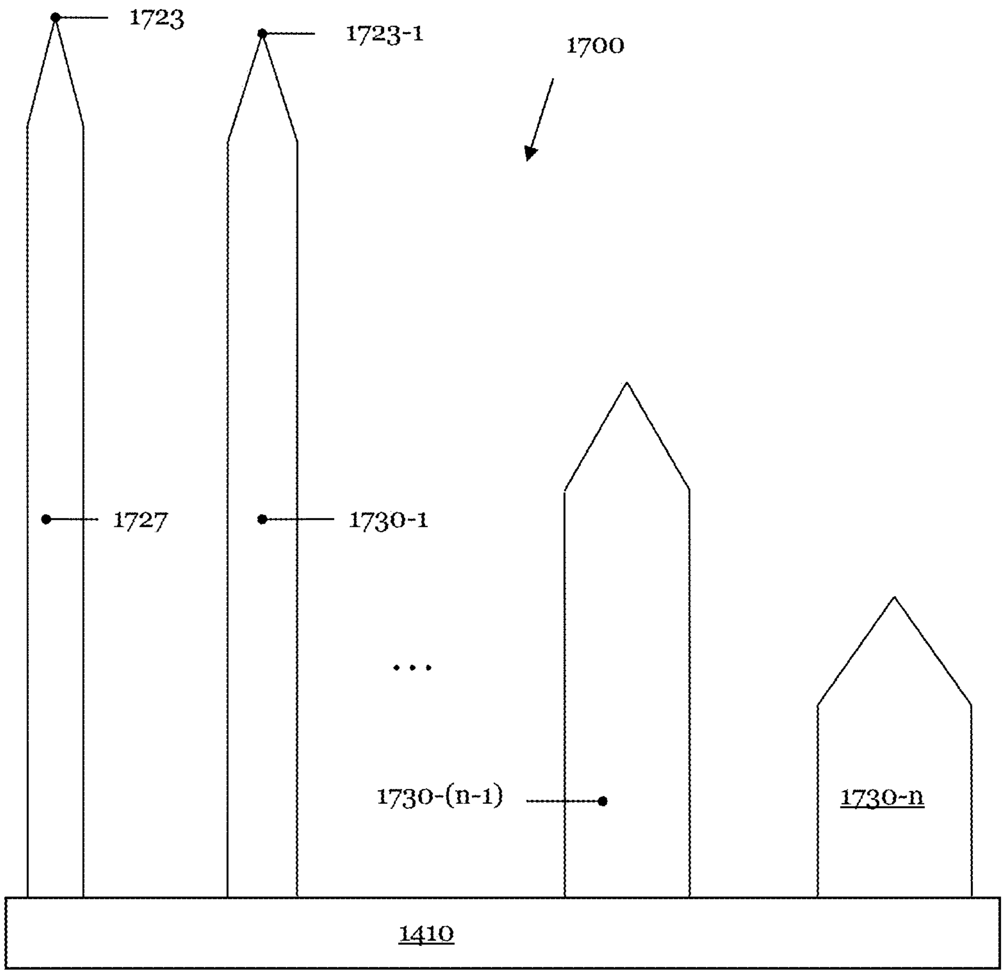
FIG. 17 presents the measuring tip carrier of FIG. 14 after the first measuring probe was changed to such an extent through use and multiple repairs that, in addition to the first measuring tip, the first second measuring tip also interacts with the specimen.

The described repair process for the first measuring tip 123 can be repeated multiple times, with each repairing step further shortening the length of the first measuring tip 123. After a few repetitions, the configuration illustrated in FIG. 17 occurs, in which the first measuring tip 1723 that was repaired multiple times has a length that is comparable to the length of the first second measuring probe 1730-1. As a result, both the tip 1723 of the multiply repaired first measuring tip 1723 and the tip 1723-1 of the first second measuring tip 1730-1 interact with the specimen 132. The combined interaction of the measuring tips 1727 and 1730-1 modifies the image, illustrated on the monitor 190, of the specimen 132 produced by the probe 122, i.e., the cantilever 110 on which the measuring tip carrier 1410 of FIG. 17 is fastened, in a specific manner. As already explained above, each elevation of a specimen 132 to be measured, whose height exceeds the length difference between the longest and the second longest measuring tip and whose width corresponds to at least the lateral spacing of the longest and the second longest measuring tip, with a height difference corresponding to the length difference of the two measuring tips, is imaged twice. Consequently, double images with always the same distance arise. When imaging a depression whose depth exceeds the length difference between the longest and the second longest measuring tip, the second longest measuring tip will contact the specimen surface before the longest measuring tip has reached the base of the depression. Double images and sudden changes in measured profile depths are therefore important indicators for a conflict between two measuring tips that are imaging at the same time.

Figure 18:
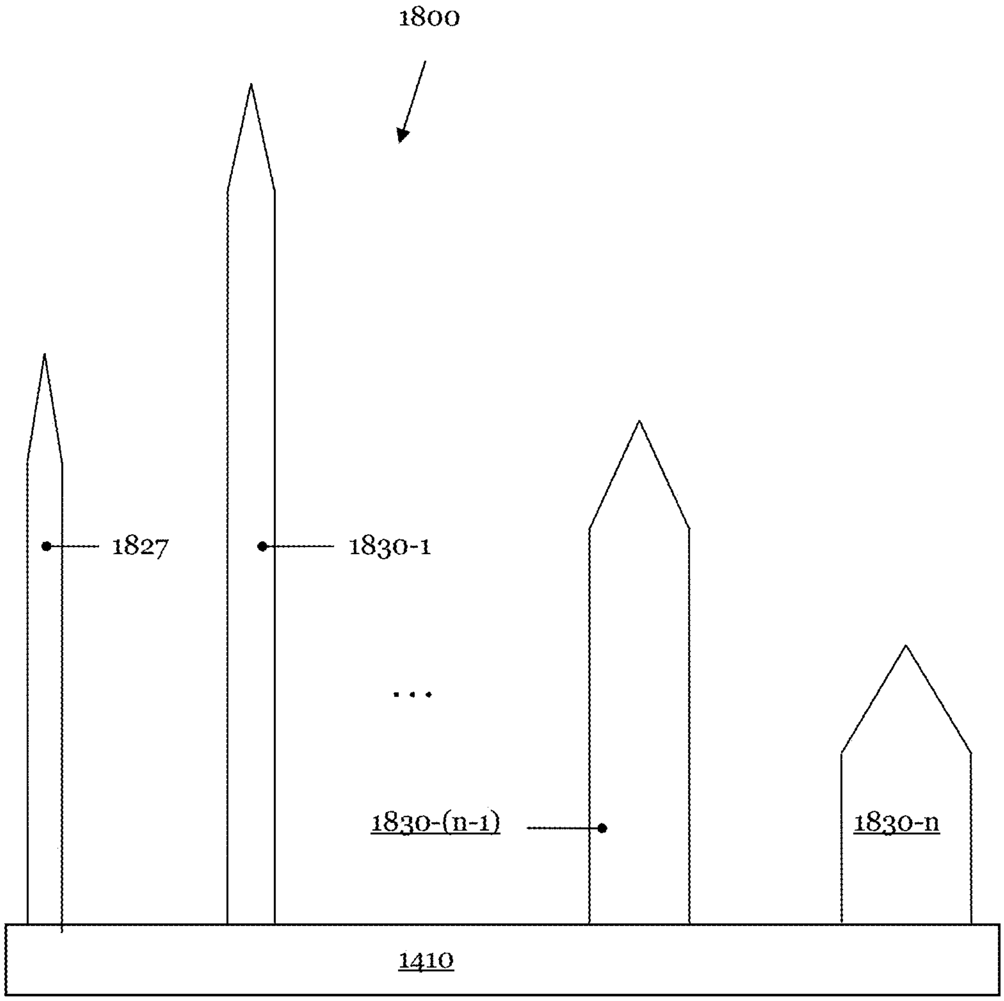
FIG. 18 represents the measuring tip carrier of FIG. 17 after the first measuring tip was changed to such an extent by irreversible processing that only the first second measuring tip still interacts with the specimen.

If the situation elucidated in FIG. 17 occurs, the measuring tip carrier 1410 is once again exposed to the action of a plasma originating from the plasma source 180. The duration of the action is chosen in such a way that the plasma, more precisely the radicals of the plasma, etch, i.e., irreversibly process, the repaired first measuring tip 1727 to such an extent that the remaining first measuring tip 1827 is shorter than the first second measuring tip 1830-1. This context is illustrated in FIG. 18. The remaining first measuring tip 1827 is shorter than the first second measuring tip by at least the length difference by which the original first measuring tip 127 was longer than the originally first second measuring tip 130-1.

Instead of the action of a plasma, the multiply repaired first measuring tip 1727 could be etched, i.e., irreversibly processed, by means of an electron-beam-induced etching process (not shown in FIG. 18).

Instead of the previously used first measuring tip 127, 1627, the first second measuring tip 130-1 (when carrying out an electron-beam-induced etching process) or the first second measuring tip 1830-1 (when carrying out a plasma etching process) is now used to examine the specimen 132. The processes described in the context of FIGS. 15 to 17 are thereupon carried out with the first second measuring tip 130-1 or 1830-1 until the end of its service life is reached.

Figure 19:
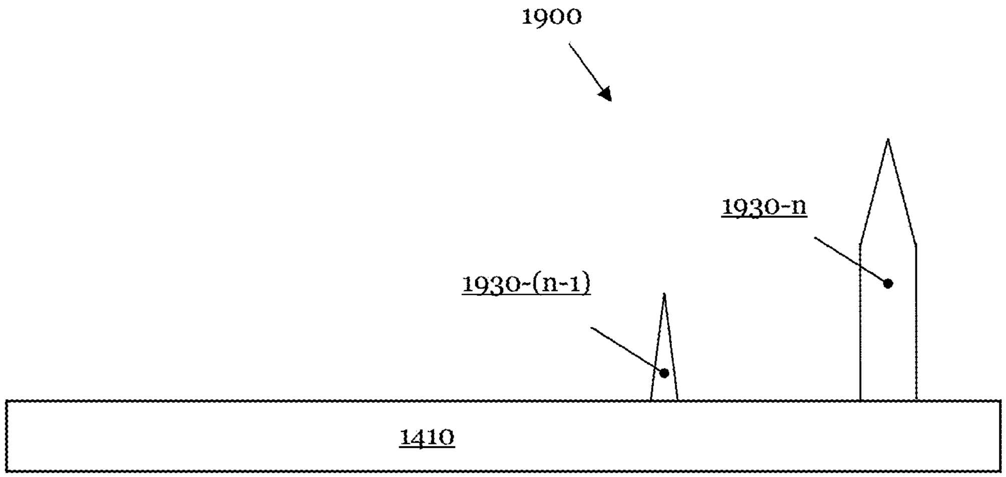
FIG. 19 shows the measuring tip carrier of FIG. 14, in which only the last or the n-th second measuring tip is ready for use as a result of use and repeated repair processes.

At the end of the service life of the first second measuring tip 130-1 or 1830-1, the examination process of a specimen 132 is continued with the second second measuring tip 130-2. The diagram 1900 in FIG. 19 shows the measuring tip carrier 1410 at the end of the service life of the (n−1)-th second measuring tip 1930-(n−1). The first measuring tip 127 and the first (n−2) second measuring tips 130-1 to 130-(n−2) have been substantially completely removed from the measuring tip carrier 1410 by the repeated isotropic plasma etching processes. In the last step, the n-th second measuring tip **130-*n* or 1930-*n* is used for analyzing a specimen 132**.

As a result of the use of a measuring tip carrier 1410 having n measuring tips, the time between two replacements of the probe 122 can be extended many times over in comparison with a probe 122 having a single measuring probe 115 or measuring probe 120. The use duration of a measuring tip carrier 1410 can once again be significantly increased by multiple repairs or restorations of worn and/or contaminated measuring tips 1510. Additionally, the service life of the individual measuring tips 127 and 130 of the measuring tip carrier 1410 could once again be significantly increased by hardening the individual measuring tips 127 and 130 prior to their first use.

Figure 20:
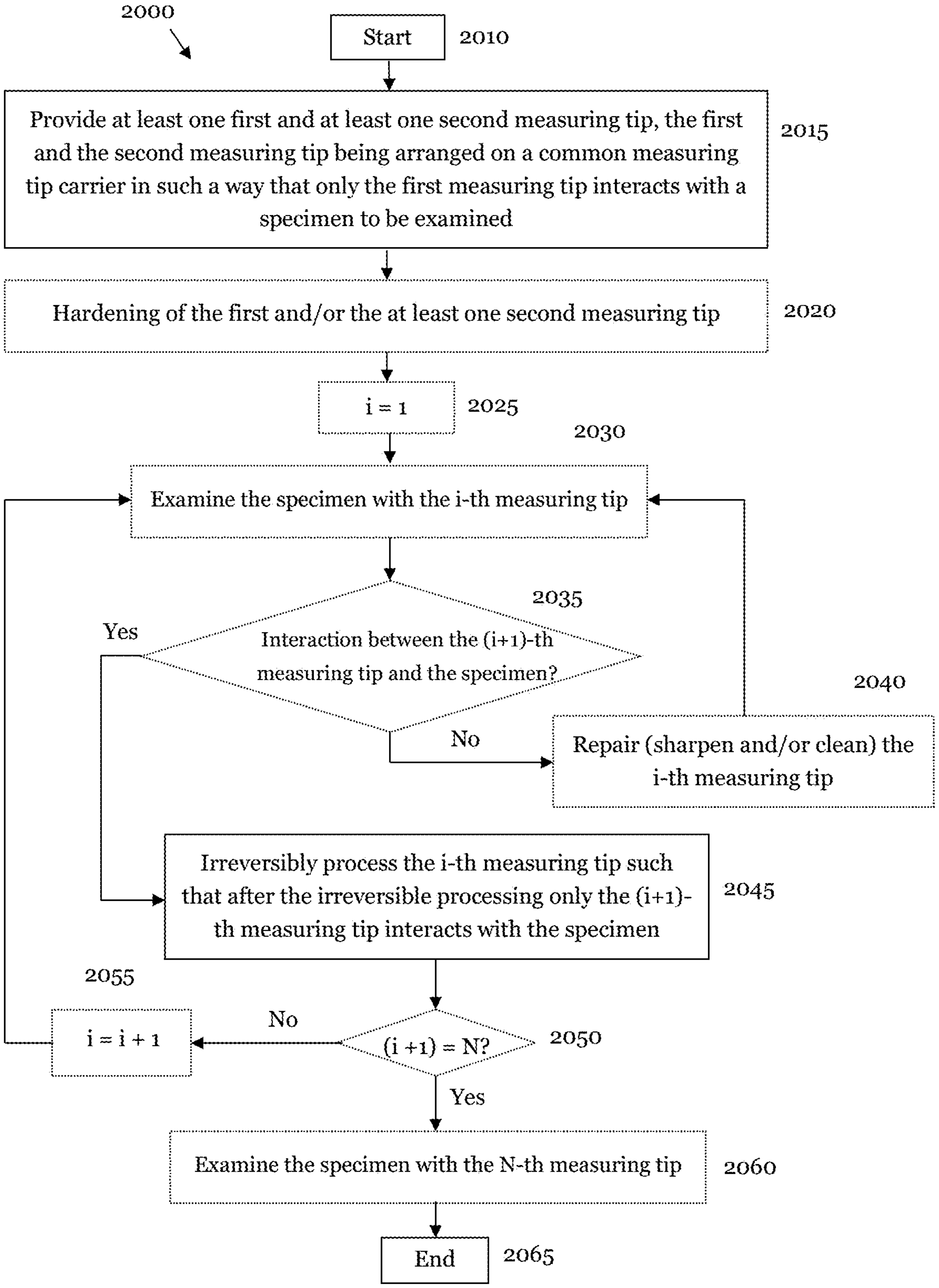
FIG. 20 reproduces a flowchart of a method for providing a measuring tip on the basis of a measuring tip carrier for a scanning probe microscope.

Finally, FIG. 20 reproduces a flowchart 2000 of a method for providing a measuring tip 127, 130 for a scanning probe microscope 100. The method begins at 2010. At least one first 127 and at least one second measuring tip 130 are provided in the first step 2015, said measuring tips being arranged on a common measuring tip carrier 1410 in such a way that only the first measuring tip 127 interacts with a specimen 132 to be examined. By way of example, this can be achieved by a corresponding difference in the length of the first 127 and the second measuring tip 130.

The following steps which are optional for the described method are identified by dotted edging. The first 127 and the second measuring tip 130 can be densified, and hence made harder, by irradiation with an energy beam, such as, for instance, an electron beam 160, in step 2020. As a result, the service life of the first 127 and the second measuring tip 130 is lengthened.

The index that counts the measuring tips 127 and 130 of the measuring tip carrier 1410 is set to one in step 2025. In the next step 2030, the specimen 132 is examined by the first 127 (in general, by the i-th) measuring tip 130-(i−1). After a predetermined examination time period, a check is carried out in decision block 2035 as to whether only the first 127 (in general, the i-th) measuring tip or also the second 130 (in general, (i+1)-th) measuring tip 130-*i* interacts with the specimen 132. If only the first measuring tip 127 forms a force sensor for the specimen 132, as required the first 127 (or i-th) measuring tip is cleaned in step 2040 and/or the tip thereof is sharpened such that the first measuring tip 1627, restored by the repair, substantially has the contour of the original first measuring tip 127. Thereupon, the method jumps to block 2030 and an analysis of the specimen 132 is carried out with the repaired first measuring tip 1627.

If it is noted in decision block 2035 that the second measuring tip 130 (in general, the (i+1)-th measuring tip 130-*i*) interacts with the specimen 132, the first measuring tip 127 is irreversibly processed in step 2045 such that, following the irreversible processing, only the second (in general, (i+1)-th) measuring tip interacts with the specimen 132. By way of example, irreversible processing of the first (in general, the i-th) measuring tip 127 can be carried out by means of a local electron-beam-induced etching process or an isotropic plasma-induced etching process.

Then, whether the index i+1 has reached the final value N is determined in decision block 2050. If this applies, the investigation of the specimen 132 is continued with the last, N-th measuring tip in step 2060. If the last measuring tip 130-*n* is no longer repairable, the method ends at step 2065. If the question of the decision block should be answered in the negative, the index i is increased by one unit in step 2055 and the examination of the specimen 132 is continued in step 2030 with the second (in general, the (i+1)-th) measuring tip 130-*i*.

The steps of the method described in this application can be carried out by hardware, firmware, software or a combination thereof.

What is claimed is:

1. A method for providing a measuring tip for a scanning probe microscope, the method comprising:

a. providing at least one first and at least one second measuring tip, wherein the first and the at least one second measuring tip are arranged on a common measuring tip carrier in such a way that only the first measuring tip interacts with a specimen to be examined, and wherein the common measuring tip carrier is attached to a cantilever of the scanning probe microscope;

b. examining, using the first measuring tip, one or more specimens one or more times; and c. after the first measuring tip has been used to examine the one or more specimens one or more times, processing the first measuring tip such that, following the processing, only the at least one second measuring tip interacts with the specimen to be examined.

2. The method of claim 1 wherein processing the first measuring tip comprises removing at least a portion of the first measuring tip.

3. The method of claim 2 wherein removing at least a portion of the first measuring tip comprises causing the first measuring tip to become shorter than the at least one second measuring tip.

4. The method of claim 2 wherein removing at least a portion of the first measuring tip comprises applying at least one of an energy-beam-induced etching process or a plasma process to remove at least a portion of the first measuring tip.

5. The method of claim 1 wherein processing the first measuring tip comprises irreversibly processing the first measuring tip.

6. The method of claim 5 wherein irreversibly processing the first measuring tip comprises removing at least a portion of the first measuring tip.

7. The method of claim 6 wherein removing at least a portion of the first measuring tip comprises causing the first measuring tip to become shorter than the at least one second measuring tip.

8. The method of claim 6 wherein removing at least a portion of the first measuring tip comprises applying at least one of an energy-beam-induced etching process or a plasma process.

9. The method of claim 5 wherein irreversible processing of the first measuring tip is implemented if at least one of the conditions are fulfilled: after the first measuring tip has been used to examine one or more specimens one or more times, the first measuring tip is shortened such that the at least one second measuring tip likewise interacts with the specimen to be examined or if the first measuring tip has a contamination that cannot be removed by a cleaning process.

10. The method of claim 5 wherein the irreversible processing is implemented by applying at least one of an energy-beam-induced etching process or a plasma process.

11. The method of claim 5 wherein irreversible processing of the first measuring tip comprises removing at least a portion of the first measuring tip from the common measuring tip carrier.

12. The method of claim 11 wherein removing at least a portion of the first measuring tip from the common measuring tip carrier comprises at least one of performing an energy-beam-induced etching process, or performing a plasma process, to remove at least a portion of the first measuring tip on the common measuring tip carrier.

13. The method of claim 5 wherein at least one of the processing or the irreversible processing is implemented within the scanning probe microscope.

14. The method of claim 1, further comprising at least one of:

sharpening at least one of the first or the at least one second measuring tip; or cleaning at least one of the first or the at least one second measuring tip.

15. The method of claim 14 wherein at least one of sharpening, or cleaning is implemented by applying at least one of an energy-beam-induced etching process or a plasma process.

16. The method of claim 14 wherein the first measuring tip has a greater length than the at least one second measuring tip upon provision and the first measuring tip has a smaller diameter than the at least one second measuring tip.

17. The method of claim 16 wherein the irreversible processing shortens the length of the first measuring tip in such a way that, thereafter, only the at least one second measuring tip interacts with the specimen to be examined.

18. The method of claim 1 wherein at least one of the first measuring tip has a length in a range from 300 nm to 10 μm, a length difference between the first and the at least one second measuring tip is in a range from 10 nm to 1000 nm, or the at least one second measuring tip has a length in a range from 100 nm to 5000 nm.

19. The method of claim 18 wherein at least one of the first measuring tip has a length in a range from 350 nm to 8 μm, a length difference between the first and the at least one second measuring tip is in a range from 20 nm to 800 nm, or the at least one second measuring tip has a length in a range from 120 nm to 4000 nm.

20. The method of claim 19 wherein at least one of the first measuring tip has a length in a range from 400 nm to 6 μm, a length difference between the first and the at least one second measuring tip is in a range from 30 nm to 600 nm, or the at least one second measuring tip has a length in a range from 140 nm to 3000 nm.

21. The method of claim 20 wherein at least one of the first measuring tip has a length in a range from 450 nm to 4 μm, a length difference between the first and the at least one second measuring tip is in a range from 40 nm to 500 nm, or the at least one second measuring tip has a length in a range from 150 nm to 2000 nm.

22. The method of claim 1 wherein at least one of the first measuring tip has a diameter in the range of 5 nm to 50 nm, the at least one second measuring tip has a diameter in the range of 30 nm to 75 nm, or the first and the at least one second measuring tip have a spacing in a range of 10 nm to 1 μm.

23. The method of claim 22 wherein at least one of the first measuring tip has a diameter in a range from 5 nm to 40 nm, the at least one second measuring tip has a diameter in a range from 30 nm to 65 nm, or the first and the at least one second measuring tip have a spacing in a range from 20 nm to 800 nm.

24. The method of claim 23 wherein at least one of the first measuring tip has a diameter in a range from 5 nm to 30 nm, the at least one second measuring tip has a diameter in a range from 30 nm to 55 nm, or the first and the at least one second measuring tip have a spacing in a range from 30 nm to 600 nm.

25. The method of claim 24 wherein at least one of the first measuring tip has a diameter in a range from 5 nm to 20 nm, the at least one second measuring tip has a diameter in a range from 30 nm to 45 nm, or the first and the at least one second measuring tip have a spacing in a range from 40 nm to 400 nm.

26. The method of claim 1, further comprising irradiating at least one of the first or the at least one second measuring tip with an electron beam in the scanning probe microscope for hardening at least one of the first or the at least one second measuring tip prior to using the first or the at least one second measuring tip.

27. The method of claim 1, further comprising analyzing at least one of the first or the at least one second measuring tip within the scanning probe microscope by irradiating at least one of the first or the at least one second measuring tip with an electron beam and detecting at least one of secondary or backscattered electrons of at least one of the first or the at least one second measuring tip.

28. The method of claim 1, further comprising depositing the first and the at least one second measuring tip on the measuring tip carrier within the scanning probe microscope using an electron beam and at least one precursor gas.

29. A scanning probe microscope, comprising:

a measuring tip carrier comprising at least two measuring tips that are arranged together on the measuring tip carrier in such a way that only a first measuring tip can interact with a specimen to be examined in the scanning probe microscope, wherein the measuring tip carrier is attached to a cantilever of the scanning probe microscope; and a processing apparatus that is configured to irreversibly process the first measuring tip such that, following the processing, only the at least one second measuring tip interacts with the specimen to be examined.

30. The scanning probe microscope of claim 29, further comprising an electron beam source configured to generate an electron beam, and a measuring head comprising a holding apparatus configured to be rotated about its longitudinal axis to align the first and the at least one second measuring tip of the measuring tip carrier substantially in antiparallel fashion in relation to the electron beam of the scanning probe microscope.

31. The scanning probe microscope of claim 29 wherein the measuring tip carrier has at least one of lateral dimensions of 1 μm×1 μm, a thickness of less than 1 μm, or a two-digit number of measuring tips.

32. The scanning probe microscope of claim 29 wherein the first and the at least one second measuring tip are carbon-based and are directly deposited on the measuring tip carrier.

33. A computer program comprising instructions which, if they are executed by a computer system of the scanning probe microscope of claim 29, cause the scanning probe microscope to, examine, using the first measuring tip, one or more specimens one or more times; after the first measuring tip has been used to examine the one or more specimens one or more times, process the first measuring tip such that, following the processing, only the at least one second measuring tip interacts with the specimen to be examined.

34. A method for providing a measuring tip carrier for a scanning probe microscope, the method comprising:

providing a measuring tip carrier comprising at least three measuring tips, the at least three measuring tips comprising a first measuring tip, a second measuring tip, and a third measuring tip, wherein the first, the second, and the third measuring tips are arranged on the measuring tip carrier in such a way that only the first measuring tip interacts with a specimen to be examined, and the measuring tip carrier is attached to a cantilever of the scanning probe microscope;

examining, using the first measuring tip, the specimen; and processing the measuring tip carrier such that, following the processing, only second measuring tip interacts with the specimen to be examined.

35. The method of claim 34 wherein processing the measuring tip carrier comprises removing at least a portion of the first measuring tip from the measuring tip carrier.

* * * * *